United States Patent [19]
Feinberg et al.

[11] Patent Number: 5,270,654
[45] Date of Patent: Dec. 14, 1993

[54] ULTRA-FAST MULTI-SECTION MRI USING GRADIENT AND SPIN ECHO (GRASE) IMAGING

[76] Inventors: David A. Feinberg, 2316 Corona Ct., Berkeley, Calif. 94708; Koichi Oshio, 175 Freeman St. (502), Brookline, Mass. 02146

[21] Appl. No.: 727,229
[22] Filed: Jul. 5, 1991
[51] Int. Cl.$^5$ .................................................. G01V 3/00
[52] U.S. Cl. ........................................ 324/309; 324/307
[58] Field of Search ............... 324/300, 312, 313, 314, 324/307, 309; 128/653.2

[56] References Cited

U.S. PATENT DOCUMENTS

| | | | |
|---|---|---|---|
| 4,021,726 | 5/1977 | Garroway et al. | 324/309 |
| 4,684,891 | 8/1987 | Feinberg | 324/309 |
| 4,792,758 | 12/1988 | Sattin | 324/309 |
| 4,796,635 | 1/1989 | Dumoulin | 128/653 |
| 4,800,889 | 1/1989 | Dumoulin et al. | 128/653 |
| 4,818,942 | 4/1989 | Rzedzian | 324/312 |
| 4,833,407 | 5/1989 | Holland et al. | 324/309 |
| 4,871,967 | 10/1989 | Rotem et al. | 324/309 |
| 4,893,081 | 1/1990 | Zur | 324/309 |
| 4,896,112 | 1/1990 | Ratzel et al. | 324/309 |
| 4,896,113 | 1/1990 | Pele | 324/309 |
| 4,901,020 | 2/1990 | Ladebeck et al. | 324/309 |
| 4,959,611 | 9/1990 | Brovost et al. | 324/309 |
| 4,970,465 | 11/1990 | Hagiwara | 324/307 |
| 5,043,665 | 8/1991 | Kuhara et al. | 324/309 |
| 5,055,789 | 10/1991 | Kondo et al. | 324/309 |

OTHER PUBLICATIONS

*Nuclear Magnetic Resonance*, Apr. 1982, vol. 143, No. 1, Crooks et al., "Nuclear Magnetic Resonance Whole-Body Imager Operating at 3.5 K Gauss$^1$", pp. 169-174.
*Magnetic Resonance Imaging*, vol. 6, No. 4, 1988, Hennig & Friedburg, "Clinical Applications and Methodological Developments of the Rare Technique," pp. 391-395.
*Magnetic Resonance in Medicine* 3 (1986), Hennig et al.: "Rare Imaging: A Fast Imaging Method for Clinical MR", pp. 823-833.
*American J. Roentgenol*, vol. 149, Aug. 1987, Rzedzian et al.: "Instant Images of the Human Heart Using a New, Whole-Body MR Imaging System," pp. 245-250.
*Radiology*, 1985, vol. 155, Feinberg et al.: "Multiple Spin-Echo Magnetic Resonance Imaging," pp. 237-442.
*Physical Review*, vol. 80, No. 4, Nov. 15, 1950, Hahn: "Spin Echoes," pp. 580-594.
*J. Phys. C: Solid State Phys.*, vol. 10, 1977, Mansfield: "Multi-Planar Image Formation Using NMR Spin Echoes," pp. L55-L58.
*Proceedings of Fifth Annual Meeting of the Society of Magnetic Resonance in Medicine*, Feinberg et al.: "Echo Planar-Inner Volume Imaging at 0.35T," p. 950.
*Radiology* 1986, vol. 161, Feinberg et al.: "Halving MR (List continued on next page.)

*Primary Examiner*—Louis Arana
*Attorney, Agent, or Firm*—Nixon & Vanderhye

[57] ABSTRACT

Fast magnetic resonance imaging uses combined gradient echoes and spin echoes. In each of one or more TR intervals, after an initial NMR RF nutation pulse, a sequence of 180° RF nutation pulses is used to refocus the RF response into corresponding string of spin echoes. However, in addition, during the time that such spin echo would normally occur after each such 180° RF nutation pulse, a plurality of alternating polarity read-out magnetic gradient pulses is utilized so as to very rapidly form a sub-sequence of gradient echoes. This fast multi-section MRI sequence utilizes the speed advantages of gradient refocusing while overcoming the image artifacts arising from static field homogeneity and chemical shift. Image contrast is still determined by the T2 contrast in Hahn spin echoes. A novel k-space trajectory temporally modulates signals and demodulates artifacts. The echo responses are selectively phase-encoded and time shifted in occurrence so as to smoothly distribute unwanted phase shift from field inhomogeneity and/or chemical phase shift effects over the entire phase encoded dimension in k-space. The technique can also be extended so as to provide T2-weighted multi-slab three-dimensional volume images.

48 Claims, 10 Drawing Sheets

OTHER PUBLICATIONS

Imaging Time by Conjugation: Demonstration at 3.5 kG," pp. 527–531.

*Magnetic Resonance in Medicine*, vol. 10, (1989), Ordidge et al.: "Snapshot Imaging at 0.5T Using Echo-Planar Techniques," pp. 227–240.

*Magnetic Resonance in Medicine*, vol. 5, (1987), Pykett et al.: "Instant Images of the Body by Magnetic Resonance," pp. 563–571.

*Magnetic Resonance in Medicine*, vol. 13, (1990), Feinberg et al.: "Echo-Planar Imaging with Asymmetric Gradient Modulation and Inner-Volume Excitation," pp. 162–169.

*Magnetic Resonance in Medicine*, vol. 16, (1990), Feinberg et al.: "Tissue Perfusion in Humans Studied by Fourier Velocity Distribution, Line Scan, and Echo-Planar Imaging," pp. 280–293.

*Magnetic Resonance in Medicine*, vol. 11, (1989), Oshio et al.: "A Computer Simulation of $T_2$ Decay Effects in Echo Planar Imaging," pp. 389–397.

*J. Phys. E: Sci. Instrum.*, vol. 21 (1988), Mansfield et al.: "Zonally Magnified EPI in Real Time by NMR," pp. 275–279.

*Journal of Magnetic Resonance*, vol. 27, Mansfield et al.: "Planar Spin Imaging by NMR," pp. 101–119.

THE SPIN ECHO SEQUENCE

THE ECHO PLANAR SEQUENCE

THE RARE SEQUENCE

THE GRASS SEQUENCE

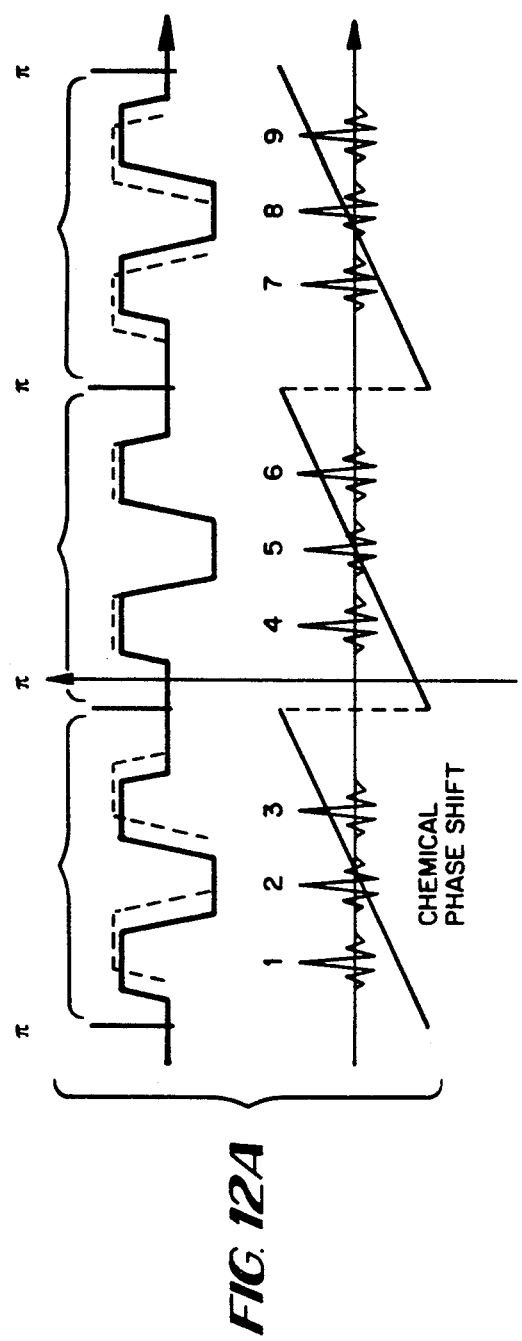
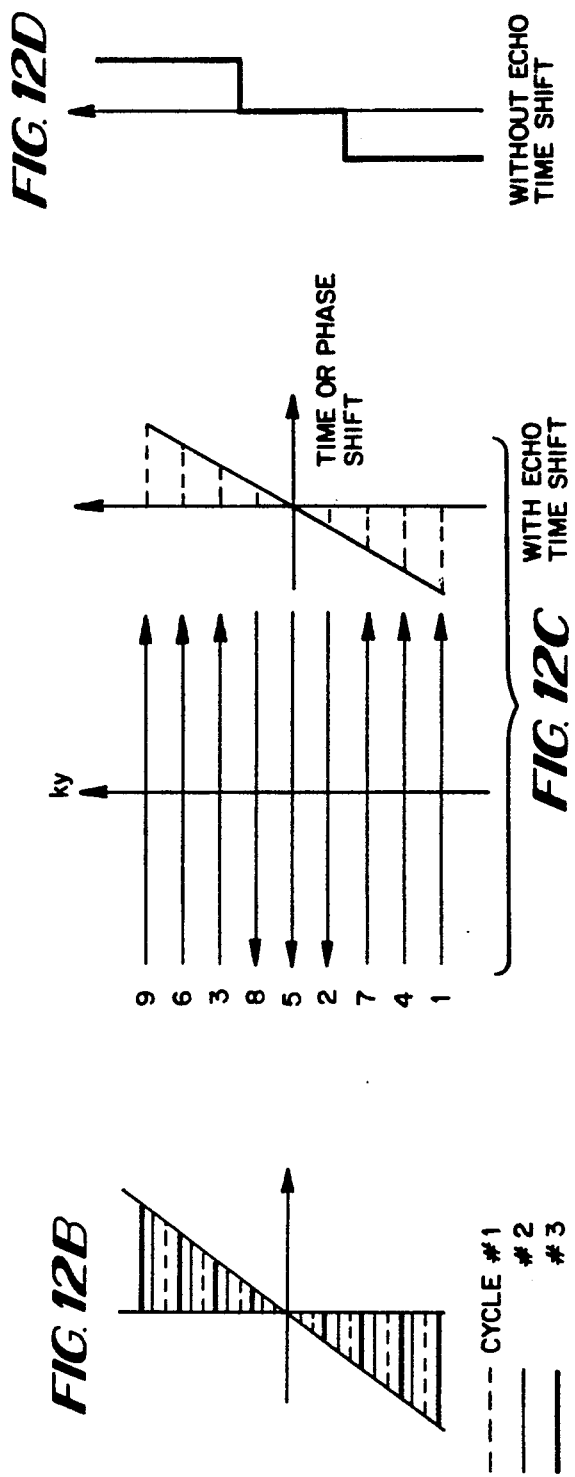
FIG. 12A
FIG. 12B
FIG. 12C
FIG. 12D

ULTRA-FAST MULTI-SECTION MRI USING GRADIENT AND SPIN ECHO (GRASE) IMAGING

BACKGROUND OF THE INVENTION

1. Field of the Invention

This invention relates generally to magnetic resonance imaging (MRI) utilizing nuclear magnetic resonance (NMR) phenomena associated with selected NMR nuclei of a patient image volume within an MRI apparatus. It is more particularly directed to method and apparatus for achieving an MRI NMR pulse sequence which combines gradient and spin echo (GRASE) MRI techniques in advantageous ways.

2. Related Prior Art

Over the last ten years or so, commercial MRI systems have become readily available. Some magnetic resonance spectroscopic imaging (MRSI) apparatuses are also now fairly well-known in the art and in use in at least laboratory environments. Similar MRI techniques are utilized in both MRI and MRSI and the term MRI will be collectively used hereinafter to refer to either or both of such techniques and apparatuses.

In conventional MRI apparatus, the relevant patient anatomy is positioned within a predetermined patient imaging volume where a large magnet (e.g, cryogenic, resistive and/or permanent magnet) structure creates a substantially constant and homogeneous magnetic field $B_o$. Conventional gradient coil structures of various types are also included in the MRI apparatus so as to permit rapid superposition of magnetic gradients with the base magnetic field $B_o$ in the image volume. Typically, these magnetic gradients are labeled $G_x$, $G_y$ and $G_z$—indicating gradients oriented along the usual x,y,z Cartesian coordinate system (the $B_o$ field typically being aligned with the z-axis of the same coordinate system). Radio frequency (RF) coils are also tightly RF coupled to the image volume for both transmitting and receiving RF signals to and from the patient tissue nuclei located therewithin.

As is well-known by those in the art, nuclei having an odd number of protons (e.g., hydrogen nuclei) will tend to align their rotating net magnetic moments with the quiescent background magnetic field $B_o$. However, when subjected to a suitable RF signal at the proper Larmor frequency (proportional to the magnetic field at the site of the nucleus), the rotating net magnetic moments of a substantial proportion of such nuclei may be tilted or nutated away from the quiescent orientation. If subsequently released from such electromagnetic nutation forces, the nuclei will tend to again revert to the quiescent orientation—and will emit characteristic RF signals which can be detected with suitable MRI RF receiving circuits. By subjecting NMR nuclei in a selected image volume to particular sequences of RF nutation pulses and magnetic gradient pulses, NMR RF responses can be detected and processed (e.g., via multi-dimensional Fourier Transformation) so as to yield data representing the spatial distribution of NMR nuclei within the imaged volume. Such data can then be displayed visually where the intensity or color of each pixel or group of pixels in a two-dimensional display represents the NMR nuclei density at a respectively corresponding spatial location within the imaged volume.

Commercially available MRI systems incorporate sophisticated computer control systems for effecting preprogrammed NMR sequences of RF and magnetic gradient pulses for particular types of MRI effects. Virtually any desired NMR sequence can be programmed within the operational limits of the RF and magnetic gradient drivers (e.g., as to magnitudes, rise and fall times, maximum duty cycles, etc). This permits virtually an infinite variety of combinations and permutations of RF and magnetic gradient pulses and many of these possibilities have yet to be explored.

Over the years, many different MRI pulse sequences have been developed and used to successfully image various types of patient tissues. A few of the more well-known MRI pulse sequences are briefly described below:

Spin Echo (SE) MRI (FIG. 2)

Traditional SE typically employs, during each repetition time interval or "TR" intervals an initial 90° RF nutation pulse followed by one or more 180° RF nutation pulses to form spin echo RF responses. Only one echo per 180° RF nutation pulse is acquired for a given image (if multiple echoes are acquired, they are each used for respectively different echo images). Each SE is differently phase-encoded in one dimension (e.g., the y-axis) from all other SE responses so as to trace out a different part of phase-encoded "k"-space. Two-dimensional Fourier Transformation of the acquired k-space data ultimately provides data that can be used to directly display a meaningful visual image on a CRT or the like. This technique therefore typically requires a long MRI data acquisition time (e.g., several minutes) to generate the required number (e.g., 256 or 512) of phase-encoded spin echoes for a complete image.

Echo Planar Imaging (EPI) MRI (FIG. 3)

Traditional EPI typically uses an initial 90° RF nutation pulse (and an optional 180° RF nutation pulse) to generate a spin echo which is thereafter repetitively refocused by a read-out magnetic gradient that is of quickly alternating polarity to form a train of multiple "gradient" echoes (GE). Each of these GE are typically differently phase encoded by either a small constant phase-encoding magnetic gradient or by small magnetic gradient pulses occurring between the echoes. While an EPI sequence can collect a full image set in a very short time (e.g., tens of milliseconds), it requires comparatively very high performance MRI system hardware.

MBEST, ABEST, and Instascan, (Oridge et al, *Magn Reson. Med.*, Vol 10, p227 (1989); Feinberg et al, *Magn, Reson, Med.*, Vol 13, p162 (1990); Rzedzian et al, *Amer. J. Roentgenol*, Vol 149, p245 (1987)) are variants of the original EPI k-space trajectory proposed by Mansfield et al. These methods continuously displace the signal trajectory along the phase axis of k-space during the echo train.

Rapid Acquisition With Relaxation Enhancement (RARE) MRI (FIG. 4)

Traditional RARE sequences typically also start with a 90° RF nutation pulse. Then a train of 180° RF nutation pulses are applied to generate multiple spin echoes. Each spin echo is differently phase-encoded to consecutively trace out k-space. However, here, after each echo a phase-decode pulse of opposite polarity is used to return to the origin in k-space. This helps suppress stimulated echo artifacts that might otherwise result from imperfections in the 180° RF nutation pulses. Since a 180° RF nutation pulse is required to generate each echo, the required image acquisition time is much longer than with EPI. RARE also typically requires multiple excitations (i.e., multiple TR intervals) to collect a full image data set whereas EPI typically may be performed in "one shot" (i.e., in one TR interval).

Small Flip Angle Methods (FIG. 5)

Traditional small flip angle (e.g., GRASS, FLASH, FISP, etc.) MRI uses an initial RF nutation pulse of reduced magnitude (i.e., less then 90°, e.g., 45° or even less) to maintain a relatively high signal to noise ratio (S/N) within a shortened repetition time TR. Perhaps the main disadvantage of this method is that resultant image contrast is different from that obtained using SE MRI—which is the currently accepted standard in clinical MRI.

EPI (e.g., Mansfield et al, *J. Magn. Reson.*, Vol 27, p101 (1977)) is known to place major hardware demands on MRI systems; including static field $B_o$ homogeneity, magnetic gradient power and magnetic gradient switching time. Although the RF refocused variant of echo planar imaging, RARE, e.g., Henning et al, *Magn. Reson. Med.*, Vol 3, p.823 (1986)) is not so hampered by chemical shift, image distortions nor other field inhomogeneity effects, it is considerably slower. The use of slice selective 180° RF nutation pulses requires more time than gradient polarity switching (in the range of milliseconds as compared to microseconds). A second disadvantage of RARE is its much higher RF energy deposition, SAR, which can exceed presently acceptable safety limits for the human body.

One earlier proposed approach to minimizing the limitations of EPI and RARE is to alternate between gradient and RF refocusing within the echo train, as suggested in earlier experiments for single shot inner volume imaging (Feinberg et al, Proceedings Fifth Annual Meeting of the Society of Magnetic Resonance in Medicine P.950 (1986)). Not only is this Abstract not coherently understandable, it is also only disclosed for use with a single subsection of a slice (defined by transversely intersecting slices). Furthermore, it does not disclose any order for combining GE with SE. Nor does this early published abstract recognize or deal with the various potential sources of artifacts and errors which arise when one actually does combine GE with SE.

While MRI has improved rapidly over the last decade, it is remarkable that multi-section 2DFT spin echo imaging (Crooks, *Radiology* (1982)) has remained the most commonly accepted standard for routine clinical MRI studies of the body and head. Since the earliest studies in 1982, there has been a progressive increase in the image signal-to-noise ratio (S/N) due to hardware improvements and pulse sequence improvements (Feinberg et al, *Radiology* (1985)). The resulting higher system S/N has permitted faster imaging times by reducing the number of excitation (NEX), otherwise used to raise S/N. Conjugate synthesis of data (Half Fourier or NEX=½) yields nearly another factor of two reduction in imaging time by using to advantage a natural symmetry in the spin echo signals for computer synthesis of half of the phase encoded signals. The conjugate synthesis method has identical tissue contrast, chemical shift and spatial resolution as regular spin echo imaging but with an expected reduction of S/N by about 30 to 40%, acceptable for many T2 weighted screening exams.

An alternative approach for faster imaging, RARE, (Henning et al, *Magn. Reson, Med.* Vol 3, p.823 (1986); Henning et al *Magn, Recon. Imag.*, Vol 6, p391 (1988)) reduces imaging time by performing phase encoding during multiple cycles (TR) of signal excitation. A reduction in the number of imaging sections can be a penalty. However, these images have similar contrast to conventional spin echo imaging, with an 8 to 16 fold reduction in imaging time from NEX=1 spin echo techniques. The imaging speed is currently limited by RARE's increased RF energy deposition in the human body (SAR) due to the rapid application of a large number of 180° RF nutation pulses. Ultimately, the speed of RARE imaging is physically limited by the fairly large total time period required for multiple slice selective 180° RF pulses during which time NMR signals cannot be read out.

In EPI (Manfield et al, *J. Magn. Reson.*, Vol 27, p.101 (1977)) signal refocusing by rapid gradient polarity switching can be used instead of the slower RF refocusing of RARE. In this way, both EPI and its modern variants, MBEST and Instascan can make images in imaging times less than 100 msec.

These EPI methods produce a larger amount of chemical shift on the image phase axis (rather than on the frequency axis), typically a 10 pixel mis-registration between water and fat. This problem can be circumvented using fat suppression methods. EPI images typically have had lower spatial resolution and S/N than spin echo imaging, which can be improved with multiple excitation cycles (multiple TR) and longer imaging times than the original single shot technique. Gradient hardware with high maximal gradient strength and short gradient rise times are required for EPI which to date has effectively limited EPI applications to a handful of research centers.

Several issued patents are also known which appear to relate to MRI techniques in which slice selective RF nutation pulses (directed to the same spatial volume) are associated with the generation of both spin echoes and gradient echoes:

U.S. Pat. No. 4,796,635—Dumoulin (1989);
U.S. Pat. No. 4,818,942—Rzedzian (1989);
U.S. Pat. No. 4,833,407—Holland et al (1989);
U.S. Pat. No. 4,896,113—Pelc (1990); and
U.S. Pat. No. 4,901,020 Ladebeck et al (1990).

Dumoulin appears primarily to use conventional echo sequences generated by gradient reversals (i.e. "gradient echoes"). There is no suggestion of using plural 180° RF nutation pulses in each TR interval.

Rzedzian appears to use plural gradient echoes after each 90 degree–180 degree RF pulse pair. Special traversals of k-space are also involved. However, there does not appear to be any suggestion in this document for repeating a 180 degree RF pulse and plural gradient echo sub-sequences after an initial 90 degree RF pulse in each TR interval—nor for a non-sequential traversal of k-space.

Holland et al generate a single spin echo and at least one gradient echo each TR and map each into a common k-space for constructing a single image. Phase encoding pulses within each TR are off-set by about 174 of k-space so that the upper two quarters of k-space are each gradually completed as successive TR intervals occur. Thereafter, complex conjugation is used to symmetrically construct the lower ¼ of k-space. There is no intention of using plural spin echoes in a single echo train, this is why the pulse sequence diagram shows redundancy of the sequence after one spin echo group of gradient echoes. There is no suggestion of multiple 180° RF pulses in one TR interval. Holland uses "multiple" TR excitations with a single spin echo during each TR excitation—which is further encoded by two gradient echoes, which are further complex conjugated to produce two additional synthesized signals, thus a factor of four reduction in imaging time from spin echo imaging.

Pelc uses plural spin-echoes and plural gradient echoes during each TR (i.e., after each 90° RF pulse). However, it appears that such are all with the same phase encoding and used for averaging to map into the same line of k-space. In other words, Pelc does not combine data from multiple spin echoes to improve imaging speed. Instead, Pelc uses information from gradient echoes adjacent the second spin echo only for various error corrections.

Ladebeck et al appears to use at least one spin echo and a plurality of gradient echoes within a single TR. However, it appears that the spin echoes and gradient echoes are separately mapped into k-space for generating separate respective images. Nor is there any apparent suggestion of taking several gradient echoes after a 180 degree RF pulse.

Also called to applicants' attention by a prior art search are the following which presently appear to be even less relevant:

U.S. Pat. No. 4,792,758—Sattin (1988)
U.S. Pat. No. 4,800,889—Dumoulin et al (1989)
U.S. Pat. No. 4,871,967—Rotem et al (1989)
U.S. Pat. No. 4,893,081—Zur (1990)
U.S. Pat. No. 4,896,112—Ratzel et al (1990)
U.S. Pat. No. 4,959,611—Brovost etal (1990)

Perhaps the closest prior art known to us at this time is:

Rzedzian and Pykett IL, Amer. J. Roentgenol. 49,245 (1987);
Feinberg DA, U.S. Pat. No. 4,684,891 (August 1987);
Hennig J, Frieburg H, Magn Reson Imag: 6:391 (1988);
Mansfield P, Ordidge R. J. and Coxan, J. Phys E21, 278 (1988); and
Feinberg et al, 1986 SMRM Abstract.

The Rzedzian et al, Henning et al and Feinberg et al papers have already been briefly referenced above. The Feinberg 1981 patent is an example using slice selective 90° and 180° RF pulses each TR interval to generate a train of phase-encoded spin echoes which after T2 correction, are used to fill in k-space for a common image.

BRIEF SUMMARY OF THE INVENTION

Although the earlier limited attempts by Feinberg et al (Supra. Soc. Magn. Res. in Med., p950, (1986)) to combine gradient echoes and spin echoes in each TR interval were flawed, we have continued to work on the problem and have now succeeded. That is to say, we have now discovered a workable class of MRI NMR pulse sequences which can effectively combine GE (e.g., as used in EPI) and SE to obtain many of the advantages enjoyed separately by each prior MRI technique—while yet avoiding some of the relative disadvantages earlier perceived for these individual techniques. By creating multiple short gradient echo trains between successive 180° RF nutation pulses in a single TR interval, field inhomogeneity and chemical shift effects evolve over the relatively short time period between adjacent 180° RF pulses—instead of the longer time of the total echo train as in EPI. Advantages over RARE, include reduced RF power deposition (SAR) and potentially much faster imaging times. This combined excitation approach, defined here as gradient and spin echo (GRASE) imaging, maintains a very fast imaging speed intermediate between EPI and RARE.

The exemplary embodiment of GRASE uses more than one 180° RF nutation pulse per TR interval and combines all the resulting echo data into a common k-space image plane for increased speed. EPI techniques (even with modern variations called MBEST and Instascan), utilize only one 180° RF pulse per TR interval in the sequence and combine data from a region around a single Hahn echo time. By using plural 180° RF pulses per TR interval, GRASE limits the amount of chemical shift and distortion errors due to field inhomogeneity.

The novel GRASE technique accomplishes high speed imaging of the body and head with tissue contrast similar to traditional spin echo imaging and with no significant increase in SAR. In the current exemplary implementation, GRASE is about 25 times faster than spin echo imaging, while maintaining high spatial resolution and image quality.

Multi-sectional body imaging in 18 seconds at a TR of 2 sec., overcomes image degradation due to respiratory motion and reduces peristalsis related artifacts. Advantages of the exemplary GRASE technique include reduced chemical shift, reduced image distortion due to field inhomogeneity and its demonstrated performance on clinical MR systems without gradient hardware modification. There also may be a major improvement in T2 weighted abdominal MRI.

Slice selective 90° and plural slice-selective 180° RF pulses produce a train of spin echo signals each TR. Each spin echo signal also is repeatedly refocused with plural read out gradients to produce multiple gradient echo signals from each spin echo. Combining this process in a standard "multi-section excitation scheme permits large improvements over current imaging methods by increasing net signal to noise ratio per imaging time and by greatly reducing imaging time, as much as 24 fold.

This invention produces multiple gradient echoes from spin echoes while the earlier work of others typically used either gradient echoes or spin echoes alone to produce images. The GRASE advantage over RARE (multiple spin echo technique) includes production of more signals per 90° RF excitation (faster imaging), higher signal to noise per imaging time and lower RF power deposition to human body (SAR). Advantages over echo planar imaging (EPI or gradient echo techniques), include decreased T2* decay, higher S/N per image, less image distortion from field inhomogeneity and chemical shift artifact. Unlike EPI, GRASE can be implemented on standard commercially available MRI imagers.

GRASE permits T2 weighted images to be made in about 18 seconds, the time of a single breath hold, thus eliminating respiratory motion blurring in MRI of the human abdomen and thorax. These multi-slice T2 weighted images are obtained in approximately 1/24th the time of current images, and so permit rapid imaging of patients likely to move in longer time intervals, for example pediatric patients or emergency trauma patients. Diffusion sensitivity of images permits thermal imaging for interventional laser therapy. GRASE also can be used to reduce imaging time of more complicated methods, 3D multi-slab images, high spatial resolution (512×512 pixel arrays), and flow imaging. Near "real-time" or cine-MR methods can also be an extension of GRASE and permit changes in MRI as a diagnostic tool, with such advantages as are currently employed in ultrasound imaging.

The GRASE sequence can be incorporated into virtually any commercially available MRI imager. Magnetic gradient performance (maximal strength, rise time and stability) determine the largest number of signals possible to obtain in each excitation cycle. More than two gradient echoes per spin echo preferably include added data correction for variable $T2^*$ effect, T2 effect and phase shifting between gradient echoes.

While the subsecond imaging time of EPI largely overcomes cardiac motion artifacts, imaging in under 20 seconds using GRASE MRI would be sufficiently fast to allow for a patient's breath hold and to substantially eliminate respiratory motion artifacts which currently limit the clinical utility of T2 weighted multi-sectional body imaging. With this goal in mind, we have combined gradient refocusing and RF refocusing techniques. Gradient refocusing methods are used to produce several signals from each of multiple RF refocused spin echoes, to obtain significant time improvements over RARE and reduced SAR. Similarly, image quality can be maintained at a very high level and with much less chemical shift than in EPI. As described further below, attempts to achieve GRASE involve what initially appear as significant obstacles due to inherent modulation of field inhomogeneity and chemical shift effects in the GRASE echo train. This has led to a totally new k-space image trajectory in the exemplary GRASE embodiment differing significantly from the k-space image trajectories typically used in RARE and EPI techniques. In comparison, the exemplary GRASE k-space trajectory sweeps through multiple discontinuous and purposefully modulated paths on the k-space phase axis as a function of time in the echo train in order to reduce image chemical shift and field inhomogeneity errors.

The exemplary GRASE technique uses multiple gradient refocusings between plural 180° RF refocusing pulses and combines all the resulting signals into one image, with a reduction in imaging time being proportional to the number of acquired signals. It is not believed possible to perform this complex method using any straightforward combination of currently known imaging methods such as combining known methods like echo planar gradient echo imaging with multiple 180° RF RARE.

In this regard, GRASE is not a method of simply generating multiple gradient echoes from a single spin echo (which several others have pursued) of the echo planar type sequences. One disadvantage of such prior attempts is the field inhomogeneity errors, $T2^*$ decay, chemical shift, and low signal to noise, all of which are known problems of EPI.

Our GRASE MRI technique is believed to be most successful, at least in part, because of four preferred features of the exemplary image sequence (which may be employed in various sub-combinations and permutations).

I. Echo Generation

First, as previously mentioned, the gradient echoes and spin echoes are sequentially combined using two or more 180° RF pulses and two or more gradient echoes per spin echo or per each 180° RF nutation pulse. This first step reduces SAR, chemical shift, field inhomogeneity errors, and $T2^*$ decay of signals and it increases signal amplitude for higher signal to noise ratios.

II. k-space Trajectory

Secondly, our exemplary GRASE technique demodulates the remaining small field inhomogeneity errors (which inherently otherwise would become modulated when these gradient echoes and spin echoes are combined—i.e., juxtaposed in interleaved fashion in k-space and jointly Fourier Transformed to make a single image). Without this second step, the advantage of reducing field inhomogeneity errors and the above mentioned problems, by the use of multiple 180° pulses may not be adequately fulfilled since severe image artifacts may result from the discontinuous pattern of the remaining small phase errors disposed throughout the total echo train. Therefore, once the signals are acquired with multiple temporally sequential magnetic gradient and 180° RF refocusings, only one specific complex order of phase encoding is preferably used to reduce or substantially eliminate this periodic pattern (modulation) of the remaining small field inhomogeneity and chemical shift phase errors on the phase axis of 2D and 3D k-space.

III. Phase And Magnitude Corrections Using the Initial Excitation

Since an initial excitation (to establish a steady state TR) is preferable anyway, we use this opportunity to acquire a template data set from which phase error and T2, $T2^*$ decay can be determined for the entire subsequent image data acquisition sequence. Once so acquired, it is preferably used to correct all such image data for phase array and for T2 and $T2^*$ decay.

IV. Echo Shift

This special GRASE phase encode trajectory may itself be sufficient to permit successful Fourier Transform image formation. However, some slight discontinuity in phase error may even then remain in the data set (because the signals are all recorded at the same respective temporal position with respect to the Hahn echo time), leading to a discontinuous or stepped pattern of phase errors (with the number of steps equal to the number of gradient echoes between each 180° RF refocusing pulse). By time shifting differently the temporal position of each group of gradient echoes (with respect to the Hahn echo time) in a specific pattern, this stepped pattern can be subdivided into multiple smaller steps. In this manner, the data set can be forced to have a substantially continuous linear variation of phase error (throughout k-space) so that the Fourier Transform has essentially linear data as an input. Our experience shows that without this step, areas in the body with fat adjacent to water density tissue may have a band of artifactual signal parallel to this tissue boundary. This step of echo time shifting thus finally makes for a substantially completely artifact free image.

These steps preferably are all utilized together in the exemplary GRASE technique so as to produce extremely high quality images with ultra fast imaging speeds. The other known ultra-fast methods of imaging with dissimilar phase-encoded gradient echoes in long echo trains (e.g., EPI, MBEST and Instascan) are performed with huge image artifacts, chemical shift, and signal-to-noise loss which can only be offset with expensive improvements in gradient system hardware to reduce these errors. However, these latter techniques must pay a huge price in image signal-to-noise ratio since they necessitate very large bandwidth signals and nevertheless do not overcome field inhomogeneity error and chemical shift problems.

It may be argued that the first exemplary GRASE step was suggested in the prior 1986 SMRM abstract by Feinberg et al. However, a different pulse sequence called "inner volume imaging" was actually there being discussed. In any case, no specific way to combine gradient refocusing and 180° RF refocusing was described. It was only stated that the two were somehow to be combined and no pulse sequence diagram was shown. Furthermore, expert workers in MRI have not been able to understand the method being described in this abstract. In fact, the 1986 abstract described a failed experiment which did not successfully produce human or biological images. Only images of homogeneous oil or water phantoms could be made due to the huge errors resulting when oil and water components were attempted to be imaged together. The Feinberg et al 1986 abstract also only described an imaging method called "inner volume-echo planar imaging" in which orthogonal planes of 90° RF excitation and 180° RF refocusing (not parallel, i.e., substantially congruent, volume selective NMR RF excitations as in exemplary multi-slice GRASE sequences) were used so that only a smaller subsection image could be produced—and not an entire cross-sectional image as produced in the exemplary GRASE technique.

3DFT imaging methods are well-known to be highly demanding on data acquisition times with the independent encoding of three spatial dimensions.

The incorporation of 3D spatial encoding with multi-sectional acquisition has been previously evaluated (Crooks et al) where lengthy imaging times were required ($T = TR \times PEy \times PEz \times NEX$) for $256 \times 8$ slices per slab. Thus, for T2 weighted images $T = (2sec) \times (256) \times (8) \times (1)$ requires 64 minutes. It has been found possible to obtain contiguous 3D T2 weighted images in more acceptable imaging times by merging multi-cycle GRASE imaging methods.

BRIEF DESCRIPTION OF THE DRAWINGS

These as well as other advantages and objects of this invention will become more fully understood by study of the following detailed disclosure of exemplary classes of GRASE MRI NMR pulse sequences, taken in conjunction with the accompanying drawings, of which:

FIGS. 12A–12D further schematically depict the exemplary echo time shifting technique of FIG. 11 and illustrate the possible impact of same in k-space and the accumulated phase-shift artifacts both with and without such echo time shifting.

DETAILED DESCRIPTION OF PREFERRED EXEMPLARY EMBODIMENTS OF THE INVENTION

Figure 1:
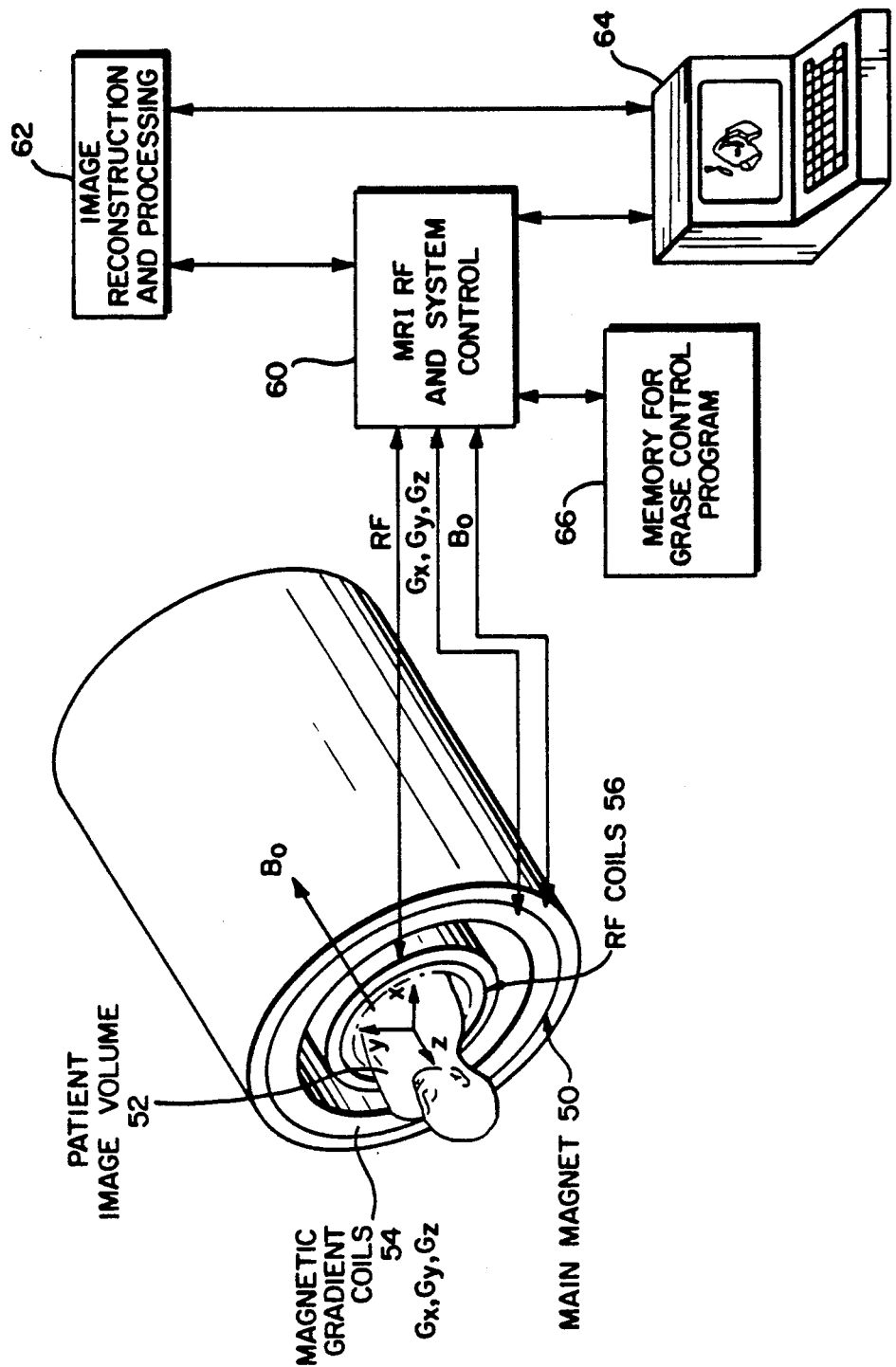
FIG. 1 is a generalized and simplified schematic block diagram of an MRI system adapted to perform exemplary GRASE MRI pulse sequences.
Figure 2:
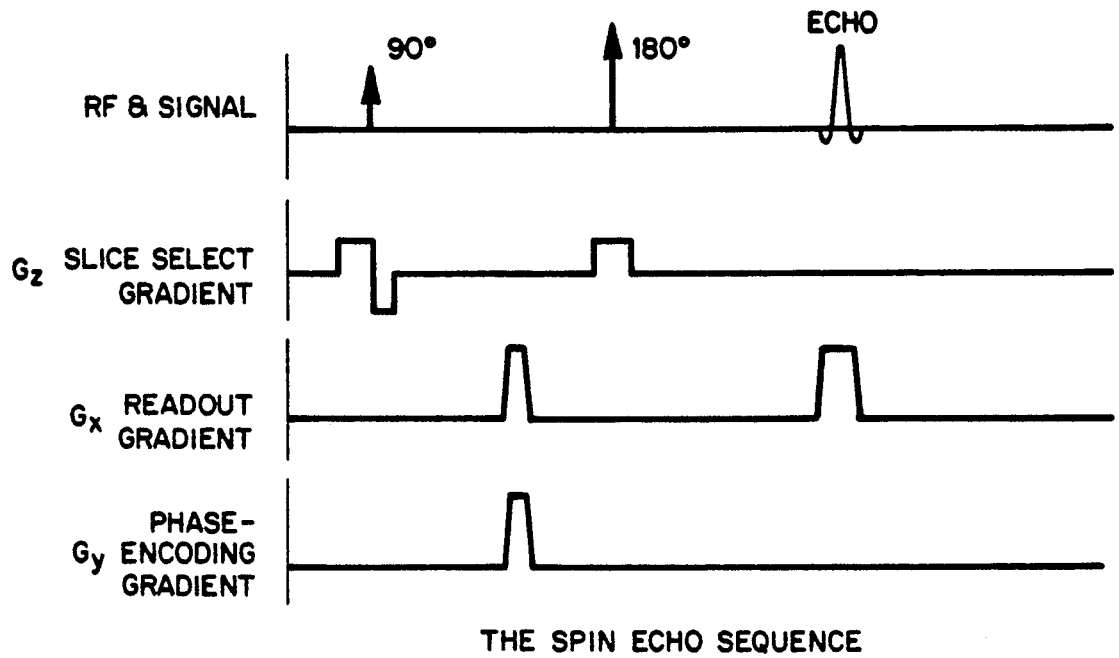
FIG. 2 through FIG. 5 schematically depict various prior art MRI pulse sequences.
Figure 3:
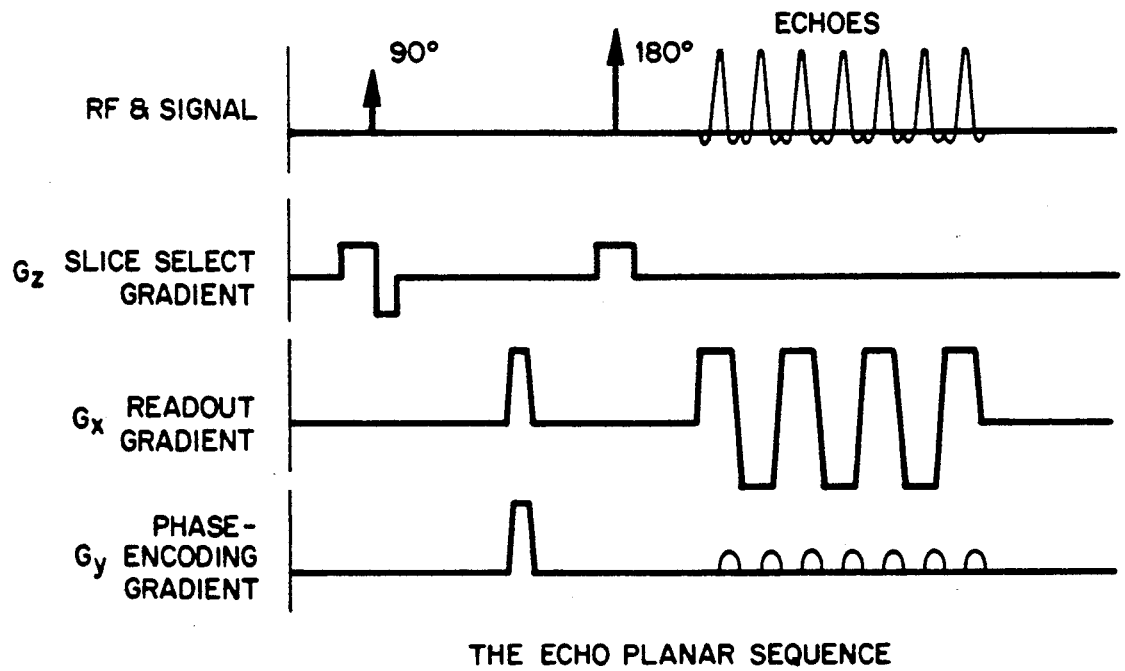
Figure 4:
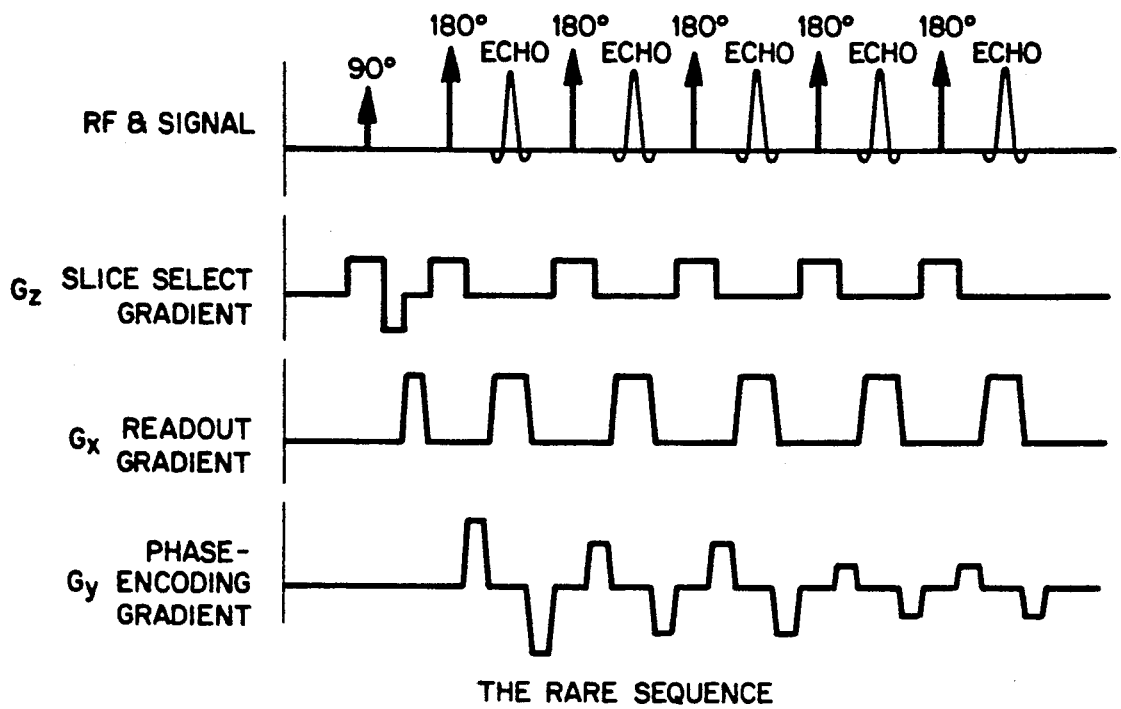
Figure 5:
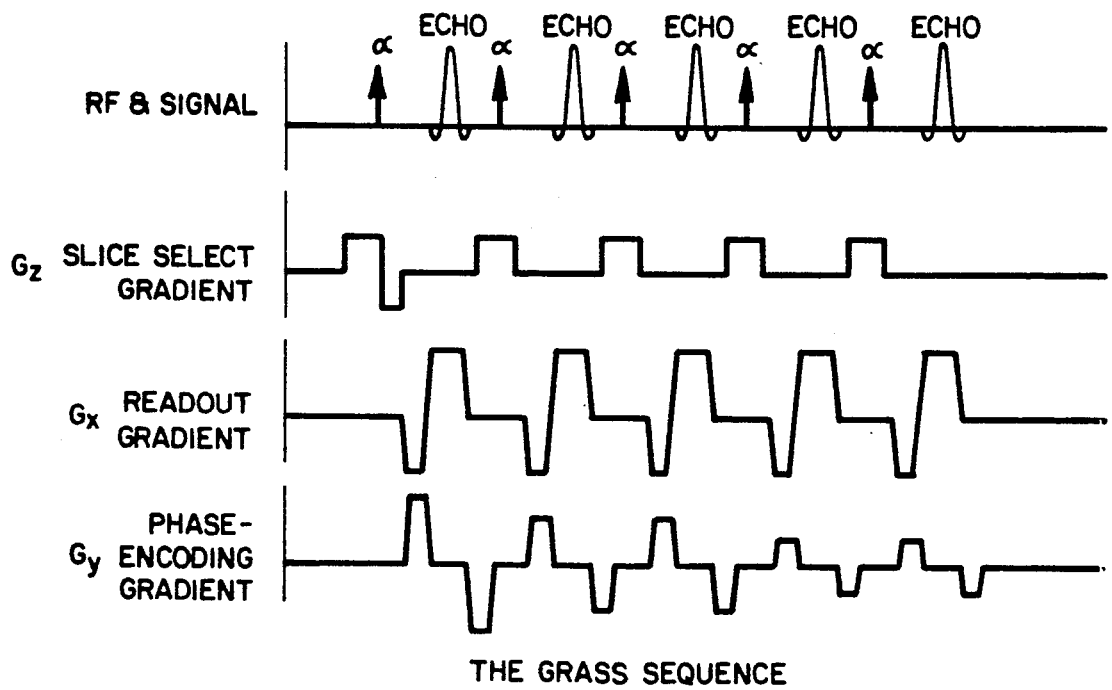

A typical MRI system is schematically depicted in block form at FIG. 1. Here a large main magnet 50 (e.g., a cryogenic or resistive electromagnet or combination thereof or, especially in lower field MRI systems, a permanent magnet structure) is used to constantly generate a substantially homogeneous background magnetic field $B_o$ throughout the patient image volume 52. Typically, $B_o$ is aligned parallel to the z-axis of the usual Cartesian coordinate system as is also depicted in FIG. 1. Conventional magnetic gradient coils 54 are typically located inside the main magnet structure and are independently controllable so as to rapidly produce one or more desired magnetic gradients in the background magnetic field within the patient image volume 52 along any of the orthogonal coordinate directions (e.g., typically referred to as magnetic gradients $G_x$, $G_y$, $G_z$). Closely coupled to the patient image volume 52 are RF coils 56 (perhaps a single coil for both transmit and receive operations or perhaps different coils for different RF signaling purposes) which permit the transmission and/or reception of NMR RF signals to and from NMR nuclei within the patient image volume 52.

These components are conventionally communicated to an MRI RF and system control 60 (most of which is typically located in a separate room outside the shielded gantry room of the main magnet 50). Either as a part of the MRI RF and system control 60 or as a separate subset of the MRI computer systems, image reconstruction and processing apparatus 62 is also provided to process the raw acquired RF NMR signal responses (typically after suitable RF signal conditioning and digital sampling) so as to produce visual images on the CRT screen of a control console 64 (or otherwise to create visualizable digitized images in magnetic, silicon, photographic film, or other visual display media). An operator may typically control the whole MRI system operation (including choice of particularly desired MRI pulse sequences) from the keyboard of console 64.

Also schematically depicted in FIG. 1 is the control program memory including a suitable GRASE control program for effecting the exemplary GRASE MRI pulse sequences hereinafter described. Those ordinarily skilled in the complex art of MRI should be able to routinely reduce the exemplary GRASE MRI pulse sequence(s) to a suitable computer control program for any particular MRI system without the need for explicit disclosure of such exemplary programming in the form of program code, flowcharts, or the like. The memory 66 in FIG. 1 may comprise any conventional program storage media such as magnetic disc, magnetic tape, silicon storage media and the like. Upon selection via operator control at console 64, the GRASE control program in memory 66 will be called up and executed by the MRI RF and system control 60 so as to produce the desired sequence of RF NMR nutation pulses and magnetic gradient pulses for the exemplary GRASE pulse sequence(s) described hereinafter.

The typical prior art MRI pulse sequences depicted in FIGS. 2-5 have already been described above and thus need no further description here. Suffice it to say that they are considerably different from the exemplary GRASE pulse sequences depicted in subsequent figures and text of this patent application.

Figure 7A:
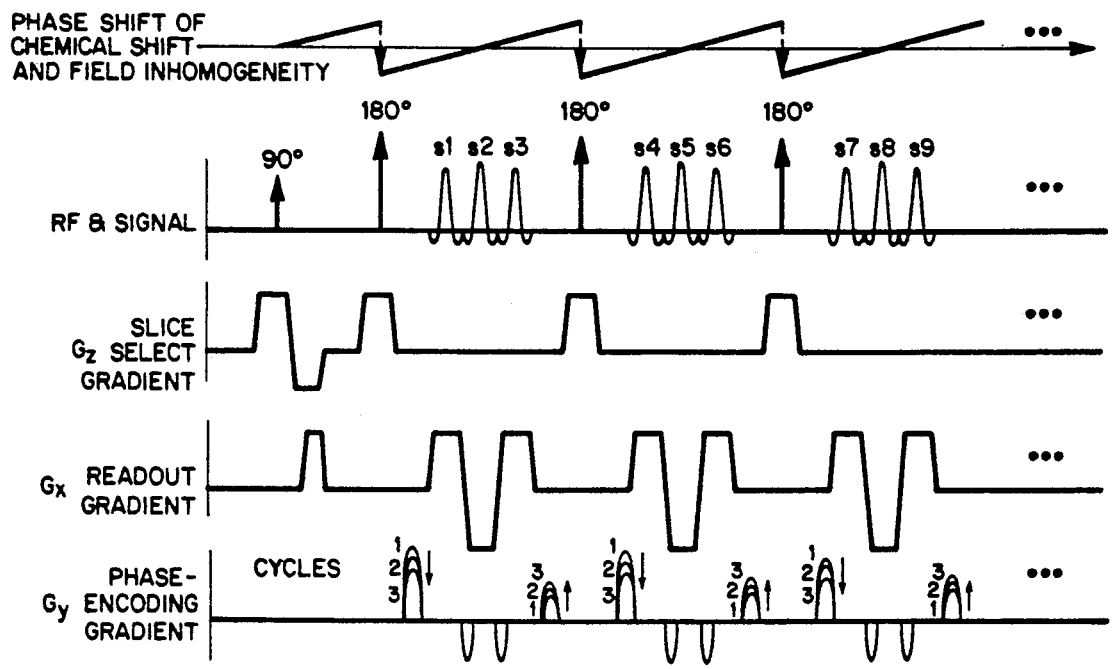
FIG. 7A schematically depicts a presently preferred type of GRASE MRI pulse sequence wherein an RF refocused echo train is formed with the CPMG scheme, and within each RF echo, and multiple lines of data are acquired using gradient reversals while each data line is phase encoded differently by $G_y$ gradient pulses (the number of each signal corresponding to the k-space location in FIG. 7B) and the entire sequence being repeated with the phase encoding lobes slightly changed (arrows)
Figure 7B:
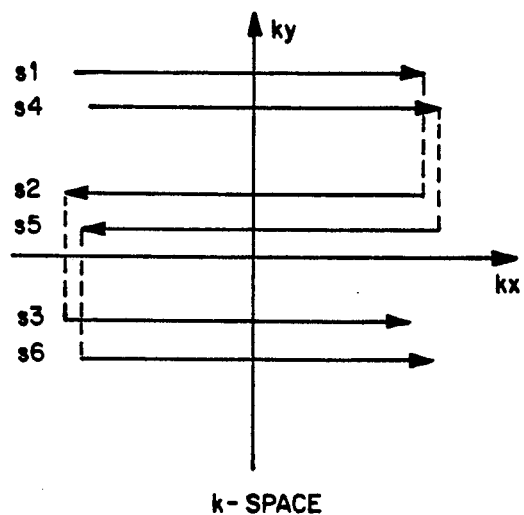
FIG. 7B schematically depicts the k-space trajectory for the exemplary GRASE MRI pulse sequence of FIG. 7A (with numbers on the left hand side corresponding to the signal numbers in FIG. 7A) and showing the trajectory to scan over a substantial portion of k-space within every RF refocused echo, with a slightly different (i.e., offset) starting position each time and with multiple successive excitation cycles thus being interleaved to fill k-space.

One exemplary GRASE pulse sequence in accordance with this invention is shown in FIG. 7A. The selected slice is first excited by a 90° RF nutation pulse, and a train of spin echoes thereafter is generated by two or more 180° RF pulses. For each RF refocused spin echo, multiple gradient echoes are generated by rapidly switching the polarity of the readout gradient. Each echo that has been generated this way is phase encoded differently by phase encoding and decoding pulses at the beginning and the end of each gradient echo train and short blips between each gradient echo. The k-plane representation of this particular exemplary phase encoding scheme is illustrated in FIG. 7A and 7B. To implement in current commercial scanners, the sequence should be repeated with the phase encoding gradients slightly offset in each excitation cycle, so that the entire k-plane is eventually covered in interleaved fashion. However, if faster hardware is available, it may also be possible to scan a full image in one-shot (i.e., within one TR interval involving only one initial 90° NMR excitation).

The GRASE pulse sequence takes advantage of both RF refocused echoes and gradient refocused echoes. Some advantages of using gradient echoes (e.g., advantages over a RARE sequence) are It is faster. Since there is less overhead of refocusing RF pulses, the required time per echo is shorter than for a RARE sequence.

There is lower power deposition. One of the problems with a RARE sequence is the high RF power deposition to the patient. Our GRASE sequence uses fewer RF pulses than RARE, and the SAR value therefore can be reduced to the current FDA guideline.

Some advantages of using RF refocused echoes (e.g., advantages over an echo planar sequence are There are fewer artifacts. In echo planar imaging, field inhomogeneity causes a spatial distortion in the acquired image. By using refocusing RF pulses, our GRASE method is less sensitive to field inhomogeneity.

In the exemplary GRASE sequence, the number of the RF refocused echoes per excitation and the number of the gradient echoes per refocusing RF pulse are adjustable to optimize the sequence to a particular application. For example, with 8 RF echoes per excitation and 4 gradient echoes per refocusing RF pulse (G4-R8), 32 echoes can be collected per excitation using RF echo interval of 20 ms and the sampling window of 2 ms, which is achievable with current commercial scanners. With a TR of 2000 msec, 256×256 multi-slice images can be obtained in 16 seconds.

A small timing error or a gradient error can cause a phase error in the reconstructed images. Usually magnitude images are used and this type of phase error does not therefore affect the image. However, if the amount of phase error is different for each echo (which is possible in a GRASE sequence), a ghost artifact will result even if only a magnitude image is obtained. Also, the magnitude of each echo varies due to the T2 decay and the T2* decay. This also causes a ghost-like artifact.

These errors can be at least partly corrected by following steps using a probe data set which is obtained with the phase encoding gradient pulse turned off. This can be done with the first excitation, which is used to establish a steady state, without increasing the scan time.

Correction steps

1. Template data collection

Collect NGE×NSE "template" data set with phase encoding pulses turned off. This can be done with the first 90° RF nutation excitation of the imaging sequence. Since an additional excitation at the beginning is necessary anyway for establishing a steady state prior to the first measurement of image data, this template data collection does not require additional scan time. From this template file, three kinds of information can be obtained, i.e. phase error, T2 and T2* decay.

2. Phase correction

Phase error mainly comes from various hardware timing errors. Two major components of this are a constant phase error within an echo and an echo position error. After Fourier transformation, or in the reconstructed image, these become zeroth and 1st order (one which is constant over the image, and one which linearly varies with spatial position). Zeroth order error can be estimated by $e_0 \arg[\Sigma s_i]$ (mean)

where si is the complex value of the i-th pixel of data after 1D transformation. First order error can be estimated by $$e_1 \arg[\Sigma s_{i-1} s^*] \text{ (auto correlation)}$$

where s is the complex value of the i-th pixel of data after 1D transformation and $s_i^*$ is the complex conjugate of s See C. B. Ahn and Z. H. Cho, *IEEE Trans. Med. Imag.* MI-6, 32 (1989). Zeroth and first order phase errors can be corrected by $$s_i = s_i(\cos e_0 + j \sin e_0)(\cos e_1 i + j \sin e_1 i)$$

This step is done after 1DFT. This correction is done for each of NGE=NSE echoes. Echoes with the same relative timing with respect to the 90° RF pulse but in different excitations can be corrected using the same template data. Additional 1DFT in the other direction will give reconstructed images.

3. T2 and T2* correction

Since the template data are obtained without phase encoding, each echo in the data set corresponds to the same DC line in k-space, and should have the same amplitude. However, as shown in FIG. 6, the magnitude changes due to T2 and T2* decay from echo.

Figure 6:
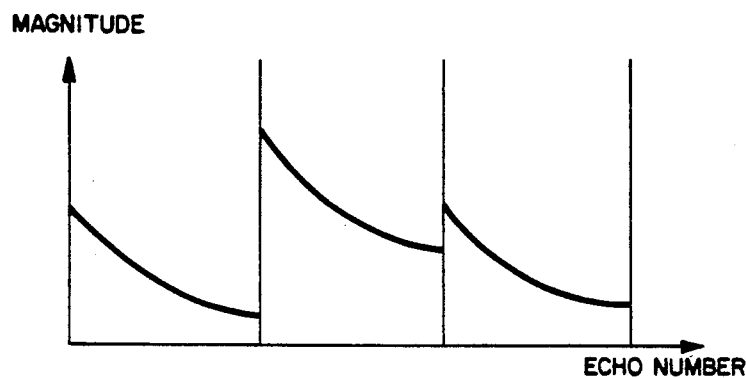
FIG. 6 graphically illustrates the magnitude changes due to T2 and T2* decay from echo for data obtained without phase decoding.

The three curves in FIG. 6 correspond to three gradient echo groups. The central group corresponds to Hahn spin echoes and the curve reflects T2 decay. The difference between the echo groups comes from T2* decay. This magnitude modulation causes artifacts in the image, seen as blurring, ghosts and ringing depending on the T2 and T2* values. This can be mostly corrected by scaling the raw data inversely (K. Oshio and M. Singh, magn. Reson. Med. 11, 389 (1989). However, this amplifies noise since the procedure includes dividing by small numbers.

It is also possible to use only one polarity of the read out gradient for signal recording to eliminate such correction steps. By using two gradient echoes on either side of TE, the T2* and T2 decay will be similar and the gradients will be of the same polarity so that time reversal is not necessary. This is at the expense of not using one of the three potential signals after each 180° RF pulse, see FIG. 7A.

Numerous phase encoding schemes can be used with our imaging method. For example, the data can be phase encoded differently on each successive signal so that k-space has a substantially continuous T2 decay across it. Alternatively, two or more images can be generated with different T2 weighting, equivalent of a first and second echo image, by making redundant phase encoding during the first and second half of the echo train, and grouping the data separately for 2DFT reconstruction.

A different phase-encoding scheme is used in the preferred exemplary GRASE pulse sequence of FIG. 7A. An RF refocused echo train is formed using the CPMG scheme (90° -180° -180° - ... ), with a number of spin echoes (NSE) and three or more (i.e., a number NGR) gradient recalled echoes being created, centered about each Hahn spin echo time. Therefore the total number of signals per echo train is the product of the number of RF refocused echoes NSE and the number of gradient recalled echoes per RF echo NGR. In our exemplary implementation, NSE is eight and NGR is three, giving the total of twenty-four signals per excitation. Eight excitations cover 256×192 data points of k-space. The standard multi-section excitation scheme was performed using slice selective RF excitations and frequency offsets for multi-slice imaging.

In EPI, without the use of multiple 180° RF pulses, the chemical shift and field inhomogeneity errors become much larger as they evolve over the entire echo train.

Each signal is phase encoded differently to scan twenty-four lines in k-space by phase encoding pulses that precede each signal. The phase encoding is returned to zero before the next RF refocusing pulse in a way similar to that used in the RARE sequence.

Figure 8C:
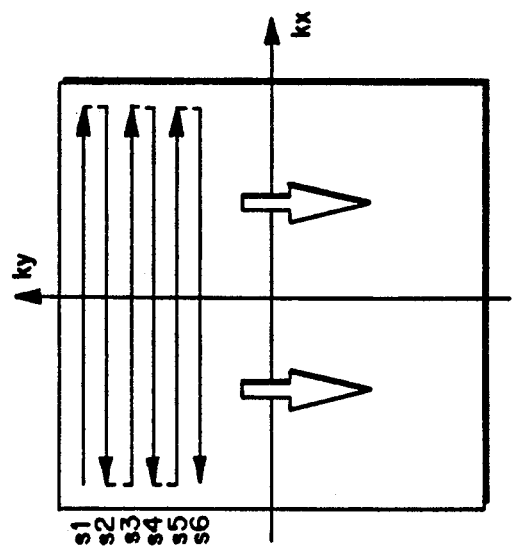
FIGS. 8A–8C compare the k-space trajectories of a) the exemplary FIG. 7A GRASE sequence, b) the RARE sequence, and c) the EPI sequence (numbers on the left hand side corresponding to the signal number order as a function of time in the echo train showing that in EPI and RARE the k-space trajectories are continuously displaced on the phase axis while in GRASE, the temporal trajectory is discontinuous and scans over almost the entirety of k-space within every RF refocused echo, with slightly different offset starting positions after each 180° RF pulse and with multiple excitation cycles thereafter filling k-space in an interleaved manner in both GRASE and multi-cycle RARE albeit both RARE and EPI move continuously in time along the ky phase axis so that in EPI the chemical shift and field inhomogeneity errors accumulate throughout the entire k-space trajectory)
Figure 8B:
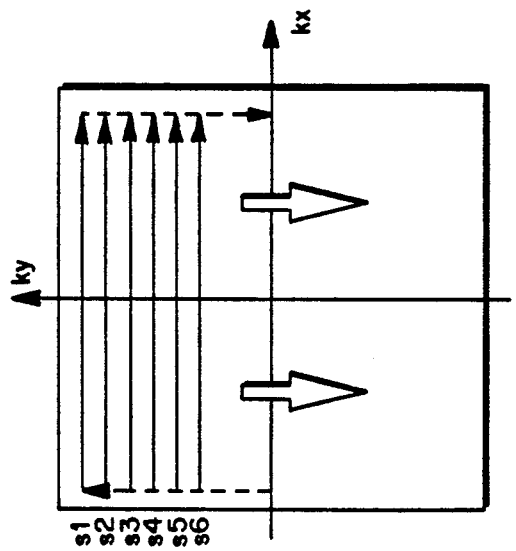
Figure 8A:
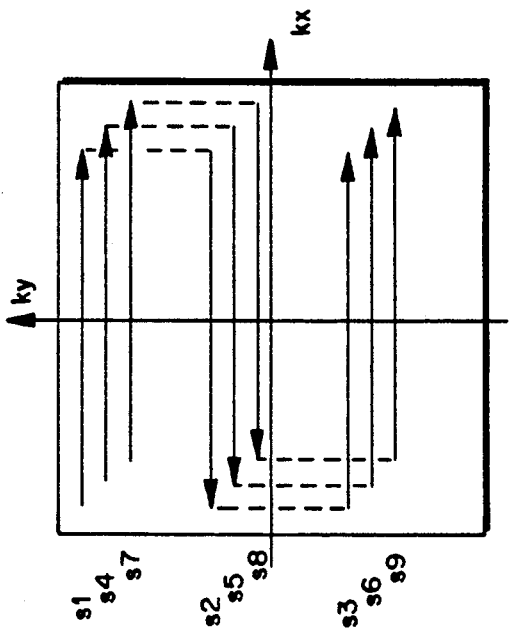

It is apparent that the effect of T2* and chemical shift differ throughout each gradient echo train. That is, these differences reoccur with the periodicity of each 180° RF pulse interval. In short, moving temporally from echo to echo, the T2* and chemical shift changes are modulated. Therefore, if this echo train were to trace out a continuous incremental path through the phase encoded axis of k-space, there would be a rapid modulation of chemical shift and T2* changes along the phase axis of k-space. After 2D Fourier Transform, this would result in ghosting artifacts in the image. In EPI, the phase encoding is continuously incremented during the echo train, resulting in an incremented displacement along the phase axis k-space as depicted in FIG. 8B.

To demodulate and effectively remove such chemical shift modulation, the k-space trajectory is purposefully further modulated with the same periodicity (i.e., as the chemical shift modulation periodicity). By reordering these signals to be continuous in phase order (rather than in time of acquisition order), the chemical shift variations may be mapped into a continuous variation across the entire phase axis of k-space. On the orthogonal frequency axis of k-space, chemical shift occurs across only the sample window time, which is small in comparison to the phase axis time intervals.

Figure 7C:
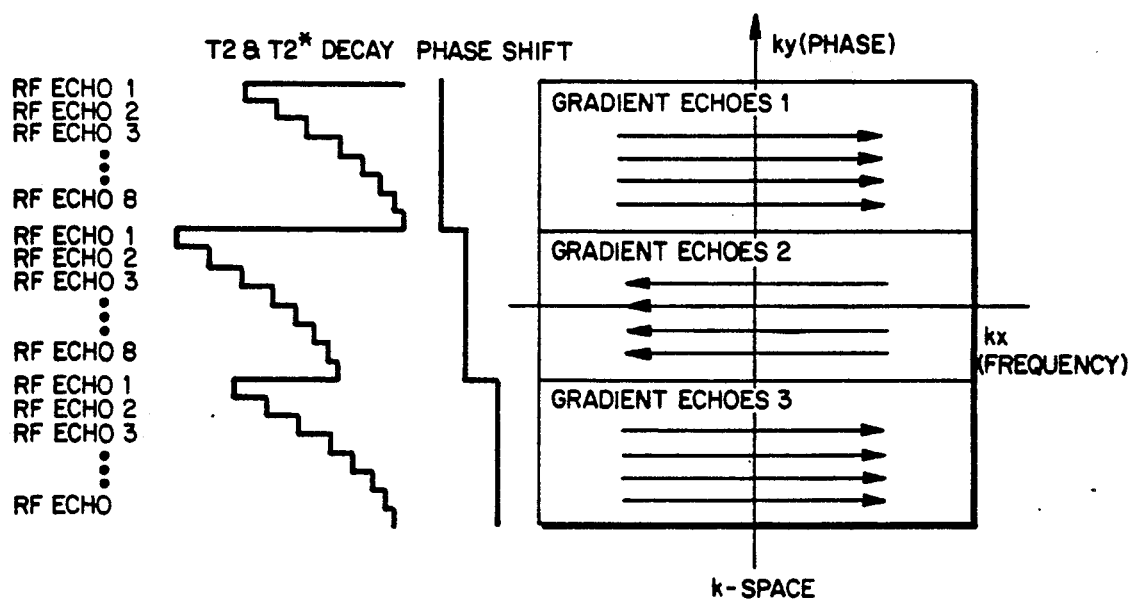
FIG. 7C schematically depicts the filled-in data structure of k-space for the exemplary GRASE sequence of FIG. 7A (the right hand side representing the k-space data set, arrows showing the direction of the data sampling, the left hand side illustrating the T2 and T2* decay, phase shift due to "chemical shift" and field inhomogeneity on the phase axis)

Specifically what occurs in the exemplary GRASE sequence of FIG. 7A is that the phase encoding sweeps through each of three large increments of k-space during the three respectively corresponding gradient recalled signals as depicted in FIG. 7B or 7C. The next set of three signals (i.e., in the next RF refocused echo and still within the same FID) have an identical k-space trajectory except for being displaced by a much smaller increment of phase encoding. Similarly, the phase of each subsequent group of three echoes is displaced by a small additional increment of gradient offset, so as to eventually fill in all adjacent lines of k-space.

After one complete excitation cycle, 24 equally spaced lines in k-space are obtained. The entire k-space is covered by repeating the excitation cycle with incremental one pixel offsets accumulating in the phase encoding. The phase encoding amount, $k_y$ for 1-th excitation, m-th RF echo and n-th gradient echo can thus be expressed as $$k_y(l,m,n) = 1 + L(m-1) + LM(n-1)$$

where L and M are the total number of 90° RF excitation cycles and number of 180° RF refocusing pulses, respectively.

After reordering the signals to have continuous phase increments in k-space, the modulation pattern for T2, T2* and the phase shifts due to chemical shift and field inhomogeneity becomes as shown in FIG. 7C. The right hand side shows the reordered k-space trajectories, while the left hand side illustrates (a) the modulation pattern of the T2 and T2* decay, and (b) the phase shift due to "chemical shift" and field inhomogeneity. In summary, chemical shift and field inhomogeneity errors are reduced in proportion to the shorter time of each gradient echo train, while the novel k-space trajectory eliminates or reduces modulation of these remaining errors.

The three large bands depicted in k-space correspond to the three gradient echoes as indicated. The T2* decay and phase shifts occur only between these groups of signals, and not within them. However, the amount of T2 decay varies depending on the position of the RF echo within the entire echo train. The T2 decay is really an exponential decay but effectively becomes a stepped decay due to the multi-excitation scheme, since the T2 decay and phase shifts of an echo are identical for each of the excitations.

The imaging time of GRASE technique can be directly expressed as $T = TR \times (NL \times NEX)/(NGR \times NSE)$ where NL is number of image lines, NEX=number of excitations, NGR=number of gradient refocused signals per spin echo, NSE=number of RF refocused spin echoes. For a TR of 2 seconds, 192 image lines, 3 NGR and 8 NSE, for T of 16 seconds. One initial excitation is used for establishing steady state of TR 2 second, giving total imaging time of 18 seconds.

The exemplary GRASE sequence of FIGS. 7A–7C was implemented on a 1.5 T system (G.E. Signa) using maximum gradient strength of 1 gauss/cm, 4 msec readout period and 3.2 msec selective RF pulse. The interval between 180° pulses was 23 msec. The effective TE (the time at which the origin of the k-space is sampled) was 104 msec. The data acquisition time was $9 \times TR$ where the initial excitation establishes steady state. By producing the first excitation without phase encoding, a template correction file results. This correction file is used for odd/even gradient echo phase shifts, and T2 and T2* magnitude filtering so as to correct for the modulation of T2 and T2* decay (e.g., see Oshio et al, *Magn. Reson. Med.* 11, 389 (1989).

A typical GRASE image of a human brain had a field of view of 24 cm. No fat suppression pulses were used. The image of fat within the skin was centered symmetrically about the brain with no relative displacement from the water component. The image had essentially the same tissue contrast as a spin echo image. Many small vessels, dark curved linear structures were resolved in the image. There was also a noted absence of ghost artifacts, spatial distortion due to the field inhomogeneity, or chemical shift in the fat signal of the skin.

It is significant that this implementation of GRASE imaging did not require gradient hardware improvements nor static magnetic field improvements over currently available commercial imaging systems. The total data acquisition time of 36 seconds for TR of 4000 msec, in this particular application, produced 22 multi-sectional 5 mm thick images with high resolution and T2 weighting of clinical utility.

It is also important to note that except for signal bandwidth differences, the high speed of GRASE imaging does not result in signal to noise loss, unlike the method of conjugate synthesis (Half Fourier, $NEX = \frac{1}{2}$), which nevertheless could be combined with GRASE imaging. Unlike RARE, the GRASE sequence uses a fewer relative number of time consuming selective 180° RF pulses. This more efficient utilization of the total possible signal period gives higher S/N per imaging time as well as a lower SAR. A modest increase in the relative number of gradient echoes to RF pulses, for example 5 or 7 instead of 3, in principle would permit further improvement in imaging speed or alternatively used to increase S/N in images. The effect of such longer gradient echo trains on T2 contrast is not known at this time.

The tissue contrast in GRASE is essentially the same as that of spin echo imaging, as demonstrated by a human head image. This can be understood from the pulse sequence diagram and FIGS. 7B and 7C which show that the second gradient recalled echo is at the Hahn spin echo position. These Hahn spin echoes cover the center of k-space which substantially determines the main image contrast. The effective TE is the center of the entire echo train in this particular experiment.

With respect to clinical body imaging, breath holding during 18 second imaging times for TR of 2 seconds will permit T2 weighted imaging in absence of respiratory motion artifacts. Several modifications of GRASE imaging, for double echo imaging, multi-slab 3D volume imaging and $512 \times 512$ images can be performed in clinically acceptable imaging times. Our results show that by interposing 180° RF pulses between gradient echo trains and by performing a novel k-space trajectory, very fast MR imaging with high spatial resolution is achieved without significant artifacts.

Head and body images of normal volunteers have been made in several imaging sessions during recent development of the GRASE technique. Two patients with known radiologic and clinical diagnosis of multiple sclerosis were imaged with GRASE during their routine T2 weighted spin echo studies.

The GRASE imaging was again implemented on a 1.5 Tesla MR system (G.E. Signa) using maximum gradient strength of 1 gauss/cm, 4 or 2 msec readout periods with 23 or 18 msec interval between 180° RF pulses, respectively. The effective TGE (the time at which the origin of the k-space is sampled) was varied from 80 msec to 104 msec. The data acquisition time was $9 \times TR$ where the initial excitation establishes steady state.

A typical GRASE head study using TR=4 sec., NEX=1 in 36 seconds had image quality sufficient to demonstrate the optic nerve as well as many small radial vessels in the white matter of the neocortex. The CSF, gray and white matter had high contrast due to the long TR and long TE, 4 sec and 104 msec, respectively.

In a different study, a comparison of tissue contrast was made in the brain between GRASE spin echo, and RARE images with similar TR=2.5 second and TE of 104–108 msec. There was similar grey and white matter and CSF contrast as seen on two representative levels. In the RARE image, the signal from fat in the skin is much higher than the similar signals in GRASE and spin echo imaging. The flow artifact in the NEX=178 spin echo image was not present in GRASE or RARE at the same level.

One representative GRASE image of a patient with multiple sclerosis had MS plaque well demonstrated in the right frontal lobe white matter.

Coronal GRASE images of the abdomen were obtained in 18 seconds, TR 2 seconds, and TE 80 msec for 11 sections. No breathing respiratory motion artifact was seen in these images since imaging was performed in a single breath hold. Renal arteries branching from the aorta were demonstrated without the motion artifact often present in spin echo images. The contrast between liver, spleen and kidney were as expected for spin echo T2 weighted images.

Sagital GRASE images of the lumbar sacral spine demonstrate the myelographic effect of CSF when TR was 3 seconds. There was central disc bulge, greatest at L2-3 disc space and decreased signal from the L4-5 disc likely from fat loss, all typical features of degenerative disc disease.

The development of CT technology for abdominal imaging, not unlike MR, required a large leap in speed to move from the early head images of 3 minute acquisition times to the present scan times of 3 to 4 seconds. CT body imaging is now of great clinically utility while MRI has been to date unable to overcome the hurdle of respiratory motion and organ peristalsis which have significantly degraded T2 weighted spin echo imaging which otherwise has great sensitivity to abdominal pathology. T2 weighted GRASE images were acquired without respiratory motion using a breath hold of 18 seconds, which most patients can perform. This has required reduction in imaging time by a factor of 25 from spin echo imaging, NEX=1.

The tissue contrast of GRASE in theory and practice is very close to that of traditional spin echo imaging since it is determined predominantly by the central gradient echoes, which in fact are Hahn spin echoes. These Hahn spin echoes cover the central portion of k-space where the strong®st image signals occur. Therefore, unlike low flip angle images of the brain which have decreased sensitivity to pathology, MS plaques can be detected using GRASE similar to spin echo imaging. Two patients were imaged with both spin echo and GRASE and the number of MS plaques were compared at identical levels in the brain by a neuroradiologist who found that GRASE imaging detected all of the plaques shown in the spin echo image.

It is significant that GRASE imaging uses fewer 180 RF pulses per TR than RARE, with a large corresponding reduction in SAR. Further improvements in GRASE imaging time and reduction in SAR are being investigated using NGR=7, yielding 12 second imaging studies, holding constant signal bandwidth and S/N. RARE imaging methods provide a maximum factor of 16 reduction in image time from spin echo imaging. The current SAR limitation prevents excitation of the maximal permissible number of slices with RARE. The speed advantage of GRASE over RARE can be expressed in terms of average signal time using exemplary time values of selective 180° RF excitation including FID spoiler gradients (Trf)=8 msec, phase encode and rephasing pulses (Tpe)=4 msec and readout gradient (Tro)=4 msec, a simple expression can be calculated,

*Average Time of*
  *signal=(Trf+Tpe+NGR×Tro)/NGR*

For RARE with NGR=1, the average time (8+4+4)/ is 14 msec per signal equivalent to the time between 180° RF pulses, For GRASE with NGR=3, the average time (8+4+12)/3 is 8 msec per signal. And for NGR=7, the average time per signal is 5.8 msec. The effect of increased NGR on T2 contrast is not known at this time. However, such changes would lead to an increase in chemical shift, which is currently less than one pixel in both head and body GRASE images.

It is important to realize that GRASE imaging is a form of multiple spin echo imaging and therefore does not have the artifacts of gradient echo images. Gradient echo imaging does not use 180° RF pulses so low S/N occurs due to non-cancellation of field inhomogeneity errors particularly in body regions far from the magnet center. These field inhomogeneity errors continuously increase with time between the RF excitation (90° or less than 90° in GRASS) and the signal refocusing time, TE. In spin echo imaging the 180° RF pulses reverse the position of the spins, leading to cancellation of field inhomogeneity errors at the Hahn spin echo time.

In comparison, GRASE imaging produces gradient echoes in the time envelope of each RF refocused spin echo. Field inhomogeneity errors evolve during the relatively short time between the gradient recalled echo and the center of the respective spin echo envelope, not the total time from the 90° RF excitation pulse as in gradient echo imaging. In the current implementation of GRASE when NGR is 3 and readout gradient is 4 msec, the field inhomogeneity error accumulates during a 15 msec period, while the total echo train extends to 208 msec. In effect, GRASE imaging, like EPI, utilizes the speed advantage of gradient refocusing techniques, but without paying the large penalty in chemical shift and field inhomogeneity errors.

With respect to clinical body imaging, T2 weighted imaging in absence of respiratory motion artifacts is possible given imaging times under 20 seconds. There are several apparent modifications of GRASE imaging such as different TE and TR for desired image contrast as well as double echo imaging, multi-slab 3D volume imaging and 512×512 images in clinically acceptable imaging times.

Thus, GRASE imaging can accomplish a T2 weighted imaging with similar contrast as spin echo. These images have high spatial resolution, are obtained in times fast enough to overcome respiratory motion artifacts, and do not produce an excessively high SAR in the body. Currently we are extending body imaging with GRASE to use 5 gradient refocusings per 180 pulse, NGR is 5, to reduce acquisition time from 18 seconds down to 12 seconds with no change in image quality or S/N except for an acceptable increase in chemical shift. It is possible that by combining the GRASE techniques with high performance gradient systems, similar excellent image quality will be obtained in even faster imaging time, using 3 or 4 excitations.

Figure 9:
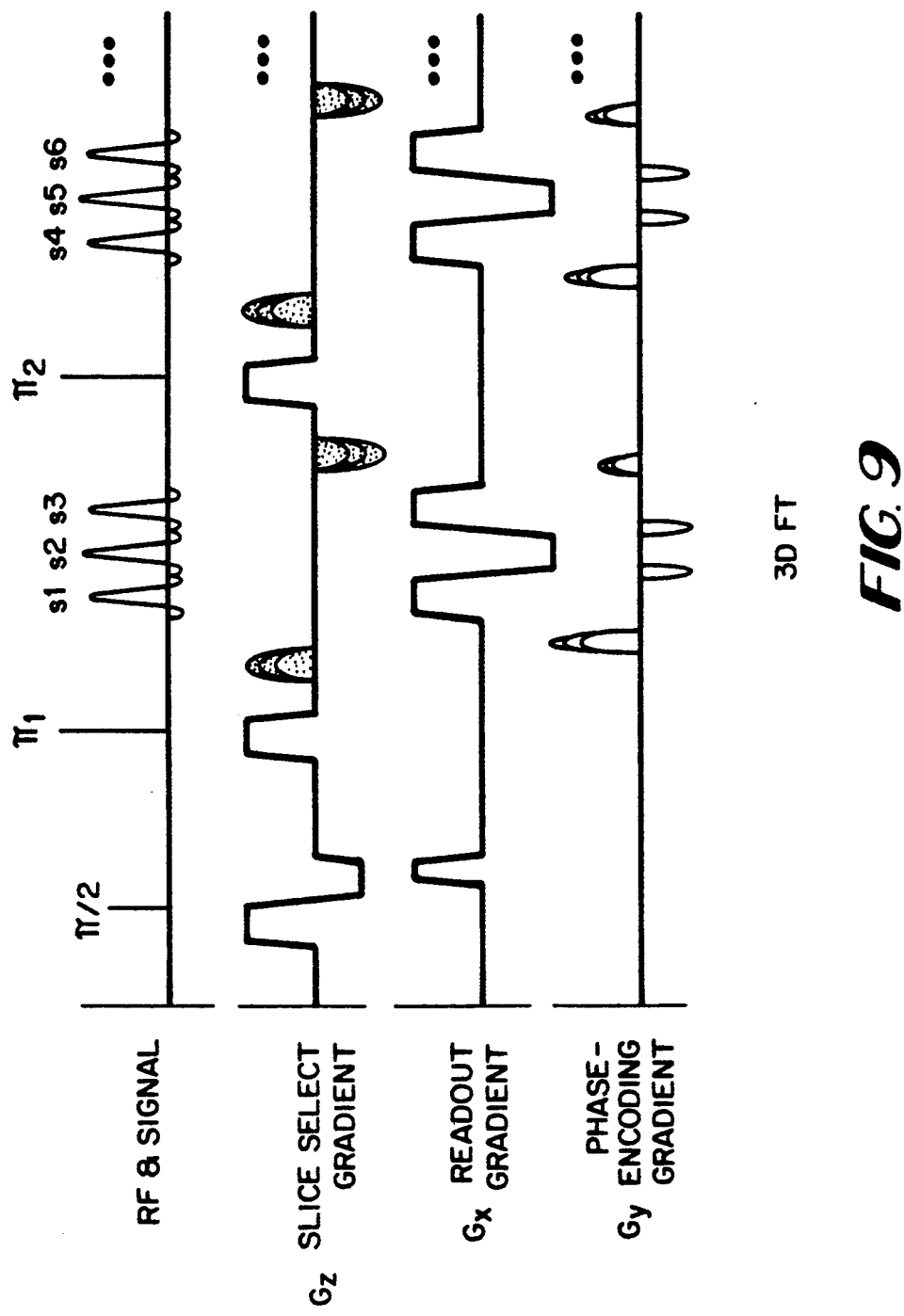
FIG. 9 schematically depicts an exemplary 3D GRASE MRI sequence.

A multi-slab 3D GRASE pulse sequence is depicted in FIG. 9. Selective excitations of M multiple slabs are performed in the standard multi-section scheme during each TR cycle. Each slab is phase encoded for inplane resolution $G_y$ by varying the phase encoding pulses during each echo train (GRASE). Each TR cycle then varies the phase encoding of the inplane axis and additional TR cycles phase encode the $G_z$ slice select axis. This permits the acquisition of N slices/slab×M slabs. Alternatively, both $G_y$ and $G_z$ could be varied during each GRASE excitation as well as during the TR cycles so that the number of slices/slab can be varied.

In most 3DFT image methods, the outer slices are of lower image quality, due to imperfections in the perfectly rectangular). The outer slices can be overlapped spatially and discarded to obtain a total of 60 continuous 1.5 mm sections. Application of 0.5 mm inplane resolution with 512×512 matrix display can also be incorporated in this imaging scheme. The application of phase encoding during trains of GRASE refocused echoes reduce the total imaging time by the same factor, 64/NGR×NSE min or 64/24=approximately 3 minutes for 60 thin T2 weighted images. The contiguous 1.5 mm sections of the body are not deteriorated in S/N given the intrinsic increased signal averaging of 3DFT. However, we have also found a higher S/N imaging time for the more efficient signal production in echo train phase encoding as compared to single spin echo encoding. This more than offsets the losses of S/N with our wider signal bandwidths.

Figure 10:
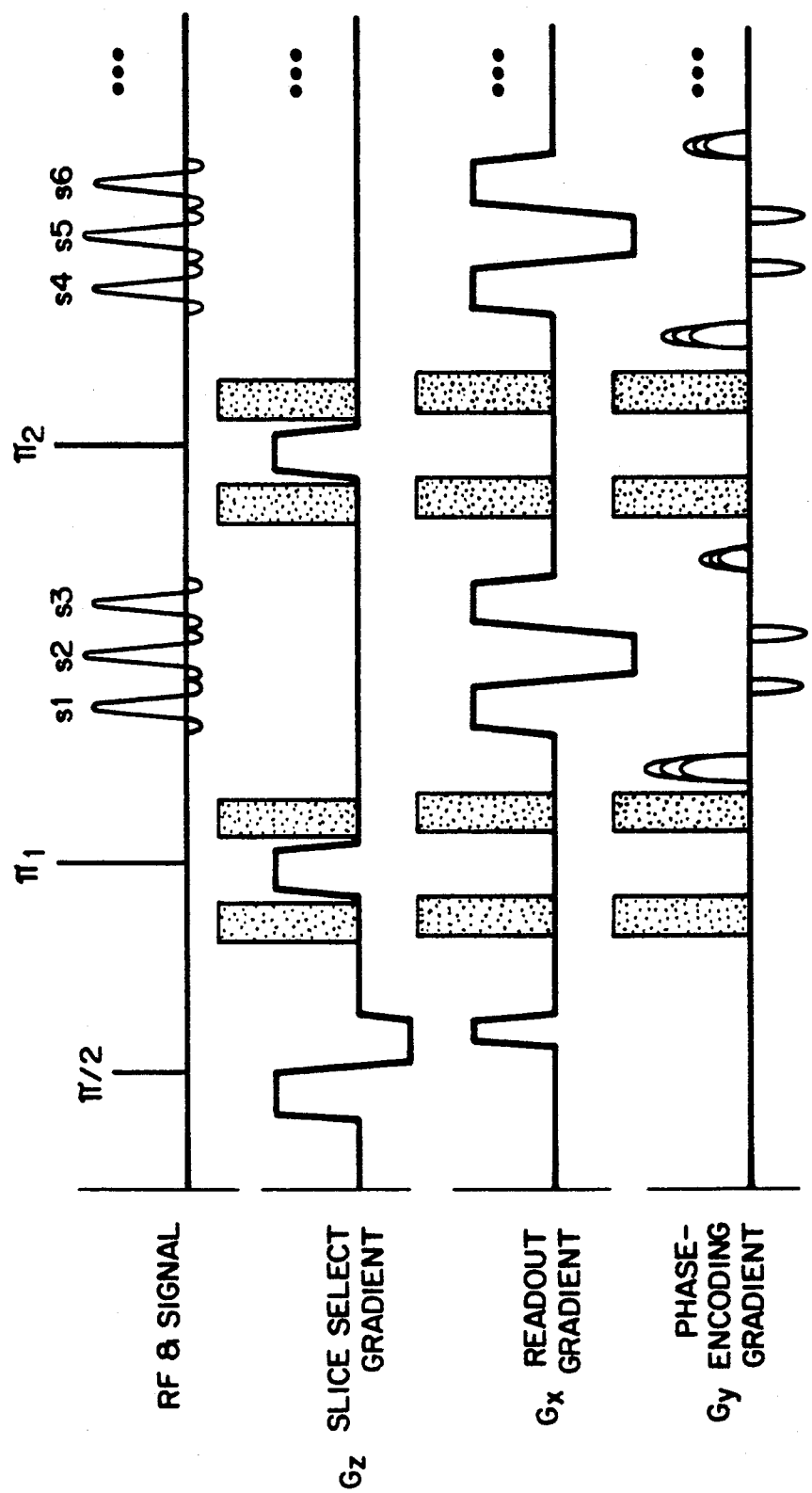
FIG. 10 schematically depicts an exemplary diffusion weighted GRASE MRI sequence.

Diffusion weighted GRASE is depicted in FIG. 10. The use of multiple pairs of gradient pulses, the Stecjkel-Tanner sequence, can be incorporated into GRASE to great advantage for diffusion weighting. This is useful for measuring the thermal changes in tissue when laser surgery is being guided by MRI. (See Perfusion Imaging by Feinberg and Jacob for further explanation and relevant mathematical equations).

Figure 11:
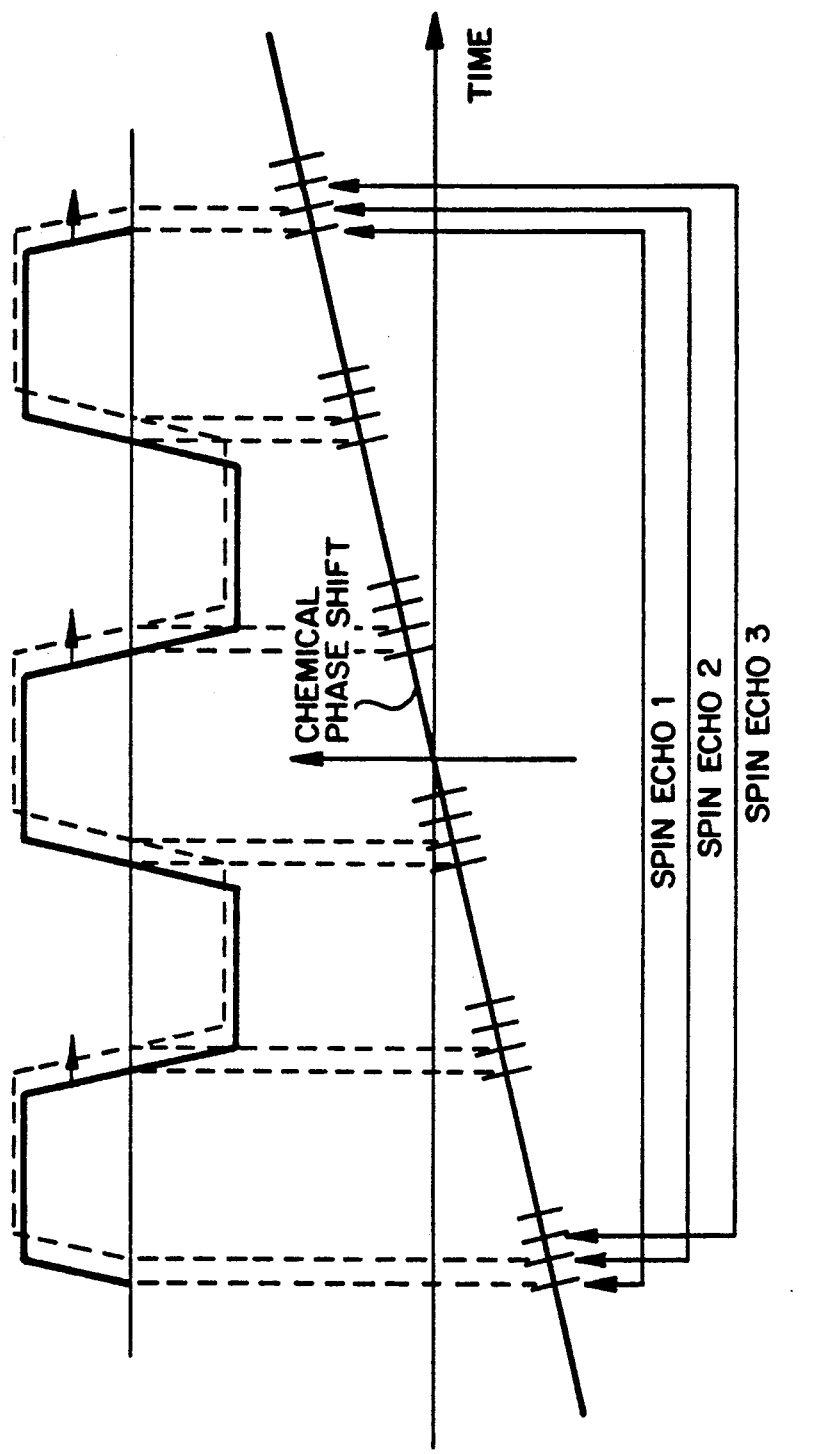
FIG. 11 schematically depicts an exemplary echo time shifting technique preferably used in all GRASE MRI sequences to further improve image quality.

Echo Time Shifting is depicted in FIG. 11 which shows how the use of NGR=3 gives three discrete sample points on the assumed chemical shift phase variation curve. If, instead, the phase axis is continuously sampled throughout the k-space data set, the image will give a standard spatial shift between the water and fat components (chemical shift). Note that the amount of chemical shift is still greatly reduced from that of echo planar methods since the phase errors evolve over a shorter time interval of NGR and are then refocused by the next 180° RF nutation degree pulse and repeated. In EPI, without the 180° RF refocusing pulses, field inhomogeneity errors continue to accumulate to give a proportionally larger chemical shift.

FIG. 11 shows diagrammatically how each group of NGR (e.g., the group of 3 gradient echoes between each pair of 180° RF pulses) is shifted in time by a small time increment. Each such group of gradient echoes then occur at different points on the phase error cure of periodically recurring chemical shifts. These groups of signals are then interleaved in k-space, as shown diagrammatically for three spin echoes in FIG. 12c (each spin echo is really a spin echo envelope of NGR signals). This method of shifting the relative temporal position of each group of NGR signals results in a more complete incremental sampling of the chemical shift phase curve so that the Fourier Transform can be provided with substantially linearly changing data and give simply a chemical shift greatly shortened from EPI. Without this echo time shift process, the sharp interfaces between water and fat may produce artifacts seen as a regional spread of the fat signal onto the tissues of more water composition.

It should be noted that this small time shifting of echoes between 180° RF pulses does not change any of the tissue characteristics in the image—it does not change the T2, spin density of T1 contrast in the image.

FIGS. 12A-12C depict how three different echo time shifts may be employed to evenly distribute the unavoidable (but relatively small) chemical shift occurring between pairs of 180° RF pulses over the entire phase-encoded dimension of k-space (FIG. 12c) as opposed to incurring three discontinuous jumps in chemical shift (FIG. 12D) if such time shifting is not employed. In effect, to avoid large phase jumps (which can cause artifacts) one can effectively sample continuously on the phase shift function of chemical shift by moving the sample windows and echo signals on the time scale. This may require one extra readout period per 180° RF pulse to prevent overlap with other gradient pulses.

In effect, the echo shift described in FIGS. 11 and 12A-12D varies the position of gradient echo trains with respect to Hahn echo times in the CPMG sequence to eliminate phase errors due to magnetic field inhomogeneity and chemical shift. While GRASE image studies of the abdomen, similar to brain studies, have minimal spatial distortions and high resolution, abdominal studies show artifactual image modulations at tissue interfaces with chemical shift. This novel method similarly improves image quality in multiple excitation echo-planar imaging.

The basic GRASE technique by itself substantially reduces both chemical shift and the effect of static magnetic field inhomogeneity including spatial distortions and T2* dependent signal loss in images. The reduced chemical shift has permitted simultaneous imaging of both the water and fat tissue components in T2 weighted GRASE imaging, similar to spin echo imaging.

However, in GRASE, the remaining smaller field inhomogeneity effects are manifested as a periodicity during the echo train. Given that there is no change in the position of the gradient echo trains with respect to the 180 refocusing or Hahn echo position, the phase shifts resulting from field inhomogeneity effects are repeatedly experienced at each respective gradient echo time. When these gradient echo signals are interleaved on the phase axis of k-space, their field inhomogeneity phase shifts produce a stepped pattern, with the number of steps equal to the number of gradient echoes.

This small non-linearity across the phase axis of k-space is produced in lieu of a more destructive periodic modulation of phase shifts without interleaving the signals. Such periodic modulations are transformed by FT into a convolution of the image with a periodic function resulting in severe ghosting or replications of the object structure. A much less severe an artifact is produced by this residual stepped modulation, seen in body images as bands parallel to the sharp interface of lipid and water tissues. This artifact is not present in images of brain tissue having no such sharp interfaces.

The GRASE sequence timing diagram is shown in FIG. 12A for simplicity without the phase encode gradients or slice selective gradients. The k-space index os each signal is shown numerically, 1..9, for this representative sequence of three gradient echoes and three spin echoes. Using gradient echoes symmetrically centered on the Hahn echo time, the field inhomogeneity phase is sampled at three time positions, leading to the three steps of phase shift in the k-space data. The signals can be described in terms of M(r)-magnetization, G(t)-magnetic field gradients and r-spatial position as, $$S(t) = \int \int M(r) \exp[-j\gamma(G(t)t \cdot r + E(r)t)] dr$$

where E(r) is the field component due to homogeneities including chemical shift and static field. Rewriting eq. (1) in terms of $\phi_1$ phase encoding and $\phi_2$ phase error, $$S(t) = \int \int M(r) \exp[-j(\phi_1 + \phi_2)] dr$$

$$\phi_1 = r \cdot \gamma \int_0^t G(t') dt'$$

$$= r \cdot k(t)$$

$$\phi_2 = \gamma E(x,y) \cdot i \cdot \Delta r$$

$$i = \left[ -\frac{N_{GE} - 1}{2}, \frac{N_{GE} - 1}{2} \right]$$

-continued $$\Delta t = \frac{T}{N_{GE}}$$

where i is the phase gradient echo index, $\Delta t$ is the duration of each gradient echo period as defined by T-total time of the gradient echo train and $N_{GE}$—total number of gradient echoes.

The time of the gradient echoes with respect to the field inhomogeneity phase shift curve, can be changed simply by shifting the position of the gradient refocusing to be slightly off-center to central the Hahn echo time, dashed lines in FIG. 12A. By imposing the appropriate increments of gradient echo time shifting, the phase shift curve is continuously sampled by the subsequent spin echo envelopes in the echo train, FIG. 11. Similarly, gradient echo time shifting is performed during multiple excitations of the GRASE sequence, for l-th excitation, m-th RF echo and n-th gradient echo, where L and M are the total number of excitations and RF refocusing, respectively. The phase shift and phase error are rewritten for the gradient echo shifted sequence, $$\phi_2 = \gamma E(x,y) \cdot i \cdot \Delta t'$$
$$\phi_1 = r \cdot k(i \cdot \Delta t')$$

$$i = \left[ -\frac{N-1}{2}, \frac{N-1}{2} \right]$$

$$\Delta t' = \frac{T}{N}$$

Using these redefined phase shifts, the signal at each $k_y$ position can be expressed as $$S(t) = \int\int M(x,y) \exp[-j(k_x x + k_y(i\Delta t')\gamma + \gamma E(x,y)i\Delta t')] dxdy$$

In this final form $E(x,y)$ is continuously sampled along the $k_y$ axis, resulting in a linear phase shift prior to FT. As a result, an expected spatial displacement or normal chemical shift will occur between water and lipid on the phase axis of the image, rather than the modulated fat-water interface as described above.

In the GRASE sequence, the index i for l-th excitation, m-th RF echo and n-th gradient echo is expressed as $$= l + L(m-1) + LM(n-1)$$

where L and M are the total number of excitations and RF refocusing, respectively.

While our experiment was designed specifically for the GRASE sequence, this method can be applied to less complicated image sequences which do not use multiple spin echoes. Gradient echo trains which are repeated with multiple excitations to fill out k-space will experience field inhomogeneity phase shifts similar to GRASE.

A multiple excitation or "partial" echo planar imaging method results with interleaving of the signals on the phase axis when M is set to zero and m=1. The gradient echo time shift becomes, $$i = l + L(n-1)$$

where M=m=1.

To study the effect of gradient echo time shift in biological tissues, GRASE imaging was performed in the abdomen of a normal volunteer. The banding artifact at the boundary of the kidney and adjacent fat is replaced by chemical shift. The absence of respiratory motion artifacts with breath holding during the relatively short 16 second data acquisition time is not possible with the twenty-four times longer scan time of spin echo imaging.

The field inhomogeneity errors and chemical shift in GRASE imaging are reduced in three steps. First, the CPMG sequence is applied to refocus the phase shifts due to field inhomogeneity, reducing the net phase errors of gradient echoes by a factor equal to the number of Hahn spin echo envelopes encoded. Secondly, the temporal periodicity of phase errors is eliminated by similarly imposing periodicity in the spatial phase encoding trajectory and reordering the signals in k-space. Thirdly, the gradient echo time shifting further demodulates the remaining phase errors to be continuous on the phase axis. The resulting images of the human body are obtained with minimal, 2 pixel, chemical shift between fat and water components. Finally, cardiac gating, synchronizing the pulse sequence to the heart cycle, further eliminates artifacts. The small displacements of the right kidney and liver due to cardiac driven pulsations are therefore removed from the image.

The partial echo planar methods similarly are improved with use of the gradient echo time shifting. Others have suggested shifting the 90° RF pulse timing, to similarly linearize the field inhomogeneity effects in partial echo planar imaging. However, these later methods would change the Hahn echo time and destroy the CPMG sequence in GRASE.

The additional time required for gradient echo shifting equals time of one gradient echo plus the gradient rise times. In the GRASE sequence, 3.2 msec, is expended during each of eight spin echo periods, for a net trade-off of 12.8 msec longer TE in these experiments. In our experience, GRASE images of the brain do not require gradient echo time shifting, given there predominant water tissue composition. The free lipid components in the surrounding scalp produces no detectable artifact (1). In body imaging, the fat-water tissue interface is accurately defined with linear sampling of field inhomogeneity factors, made possible with these new methods.

Although the exemplary drawings depict conventional substantially rectangular gradient pulses, other pulse shapes could be used instead. For example, sinusoidally shaped gradient pulses (with appropriate interpolation in k-space) could be used in accordance with the teaching of Rzedzian (U.S. Pat. No. 4,818,942).

While only a few exemplary embodiments of this invention have been discussed in detail, those skilled in the art will recognize that many variations and modifications may be made in these exemplary embodiments while yet retaining novel features and advantages of this invention. Thus, it is intended that the appended claims cover all such variations and modifications.

What is claimed is:

1. A method for generating MRI signals from NMR nuclei within an image volume, said method comprising:
nutating nuclei within a slice-volume to initiate a TR interval;
repetitively applying 180° NMR RF pulses to further nutate nuclei within the same said slice-volume by substantially 180° at subsequent intervals within the same TR interval and thus to generate a train of NMR spin echoes;

between pairs of said 180° NMR RF pulses, applying a plurality of alternate polarity read-out magnetic gradient pulses to produce sub-sequences of plural gradient echoes occurring between said 180° NMR RF pulses.

2. A method for generating MRI signals from NMR nuclei within an image volume, said method comprising:

nutating nuclei within a slice-volume to initiate a TR interval;

repetitively applying 180° NMR RF pulses to further nutate nuclei within the same said slice-volume by substantially 180° at subsequent intervals within the same TR interval and thus to generate a train of NMR spin echoes;

between pairs of said 180° NMR RF pulses, applying a plurality of alternate polarity read-out magnetic gradient pulses to produce sub-sequences of plural gradient echoes, and phase-encoding each said gradient echo within each sub-sequence to traverse a discontinuous trajectory in k-space which is interleaved with the trajectories of other sub-sequence to traverse a discontinuous trajectory in k-space which is interleaved with the trajectories of other sub-sequences so as to more evenly distribute field inhomogeneity and/or chemical phase shift effects over the phase-encoded dimension of k-space.

3. A method as in claim 2 wherein the time occurrences of gradient echoes within different said sub-sequences are relatively shifted so as to more evenly distribute field inhomogeneity and/or chemical phase shift effects over the phase-encoded dimension if k-space.

4. A method as in claim 2 further comprising, at the conclusion of each said subsequence, applying a phase-decoding magnetic gradient pulse to return nuclei phase encoding to the same point in k-space prior to application of the next 180° NMR RF nutation pulse.

5. A method for generating MRI signals from NMR nuclei within an image volume, said method comprising:

generating a train of NMR spin echoes using a sequence of plural 180° NMR RF nutation pulses;

for each such RF refocused spin echo, generating a sub-sequence of NMR gradient echoes by using a sequence of alternating polarity read-out magnetic gradient pulses;

phase-encoding each such gradient echo to trace different trajectories in k-space, the phase-encoding being modulated to cause gradient echoes of each said sub-sequence to have k-space trajectories which are interleaved with those of other such sub-sequences so as to more evenly distribute T2* and/or chemical phase shift effects over the phase-encoded dimension of k-space; and after each said sub-sequence of gradient echoes, applying a phase-decoding magnetic gradient pulse to return nuclei phase encoding to the same point in the k-space prior to generation of the next NMR spin echo.

6. A method as in claim 5 wherein said train of NMR spin echoes is generated, during each of plural TR intervals, by an initial 90° NMR RF nutation pulse followed by a sequence of plural 180° NMR RF nutation pulses, each said RF nutation pulse occurring during a slice-select magnetic gradient pulse $G_z$.

7. A method as in claim 6 wherein said sub-sequences of NMR gradient echoes are generated by a sequence of alternating polarity $G_x$ read-out magnetic gradient pulses occurring after each 180° NMR RF nutation pulse.

8. A method as in claim 7 also including use of a dephasing $G_x$ read-out magnetic gradient pulse occurring between said initial 90° NMR RF nutation pulse and the first of said 180° NMR RF nutation pulses.

9. A method as in claim 7 wherein said phase-encoding during each sub-sequence is achieved by an initial $G_y$ magnetic gradient pulse of a first polarity and by subsequent $G_y$ magnetic gradient pulses of a second polarity and wherein said phase-decoding is achieved by a further $G_y$ magnetic gradient pulse of said first polarity.

10. A method for generating MRI signals, said method comprising:

(a) subjecting NMR nuclei within an image volume to a perturbing NMR RF nutation pulse;

(b) thereafter subjecting said NMR nuclei to
  (i) a 180° NMR RF nutation pulse followed by
  (ii) a plurality of alternating polarity magnetic gradient read-out pulses to generate a sequence of plural gradient echoes occurring after said 180° NMR RF nutation pulse and before application of another 180° NMR RF nutation pulse, and
  (iii) repeating steps (i) and (ii) to generate a further sequence of gradient echoes.

11. A method as in claim 10 wherein said perturbing NMR RF nutation pulse is a 90° NMR RF nutation pulse.

12. A method as in claim 10 wherein step (b) (iii) includes plural repetitions of steps (i) and (ii) to generate plural further sequences of gradient echoes.

13. A method as in claim 10, 11 or 12 wherein steps (a) and (b) are repeated in each of plural TR intervals to generate additional sequences of gradient echoes.

14. A method as in claim 10, 11 or 12 wherein said NMR RF nutation pulses occur during a slice volume selecting magnetic gradient pulse in a multi-slice sequence.

15. A method as in claim 14 wherein each magnetic gradient read-out pulse is preceded by a phase-encoding magnetic gradient pulse of predetermined magnitude, different from the magnitude of other such phase-encoding pulses.

16. A method for generating MRI signals, said method comprising:

(a) subjecting NMR nuclei within an image volume to a perturbing NMR RF nutation pulse;

(b) thereafter subjecting said NMR nuclei to
  (i) a 180° NMR RF nutation pulse followed by
  (ii) a plurality of alternating polarity magnetic gradient read-out pulses to generate a sequence of gradient echoes, and
  (iii) repeating steps (i) and (ii) to generate a further sequence of gradient echoes.

said NMR RF nutation pulses occurring during a slice volume selecting magnetic gradient pulse in a multi-slice sequence, each magnetic gradient read-out pulse being preceded by a phase-encoding magnetic gradient pulse of predetermined magnitude, different from the magnitude of other such phase-encoding pulses, and wherein the magnitude of phase-encoding magnetic gradient pulses with each repetition of steps (i) and (ii) generate MRI gradient echoes respectively corresponding to non-contiguous trajectories in k-space, the MRI gradient echoes generated from other repetitions of steps (i) and (ii) respectively filling in the remaining contiguous trajectories in k-space in an interleaved fashion.

17. A method as in claim 16 wherein the phase-encoding magnetic gradient pulses have magnitudes which generate a sequence of MRI gradient echoes in k-space having substantially reduced phase shifts between next-adjacent k-space echoes caused by field inhomogeneity and/or chemical shift effects occurring during each repetition of steps (i) and (ii).

18. A method as in claim 17 wherein the phase shifts caused by said field inhomogeneity and/or chemical shift effects increase monotonically in approximately equal amount from one gradient echo to the next throughout the phase-encoded dimension of k-space.

19. A method as in claim 18 wherein prior to each repetition of steps (i) and (ii), a phase-return magnetic gradient pulse is applied to said NMR nuclei having polarity and magnitude for substantially cancelling all prior phase-encoding magnetic gradient pulses and thus momentarily returning the NMR nuclei to the same point in k-space.

20. A method for generating MRI signals, said method comprising:
   (a) subjecting NMR nuclei within an image volume to a perturbing NMR RF nutation pulse;
   (b) thereafter subjecting said NMR nuclei to
      (i) a 180° NMR RF nutation pulse followed by
      (ii) a plurality of alternating polarity magnetic gradient read-out pulses to generate a sequence of gradient echoes, and
      (iii) repeating steps (i) and (ii) to generate a further sequence of gradient echoes.
   said NMR RF nutation pulses occurring during a slice volume selecting magnetic gradient pulse in a multi-slice sequence,
   each magnetic gradient read-out pulse being preceded by a phase-encoding magnetic gradient pulse of predetermined magnitude, different from the magnitude of other such phase-encoding pulses, and
   wherein prior to each repetition of steps (i) and (ii), a phase-return magnetic gradient pulse is applied to said NMR nuclei having polarity and magnitude for substantially cancelling all prior phase-encoding magnetic gradient pulses and thus momentarily returning the NMR nuclei to the origin of k-space.

21. A method as in claim 19 wherein steps (a) and (b) are repeated in each of plural TR intervals to generate additional sequences of gradient echoes.

22. Apparatus for generating MRI signals from NMR nuclei within an image volume, said apparatus comprising:
   means for nutating nuclei within a slice-volume to initiate a TR interval;
   means for repetitively applying 180° NMR RF pulses to further nutate nuclei within the same said slice-volume by substantially 180° at subsequent intervals within the same TR interval and thus to generate a train of NMR spin echoes;
   means for applying a plurality of alternate polarity read-out magnetic gradient pulses between pairs of said 180° NMR RF pulses to produce sub-sequences of plural gradient echoes occurring between said 180° NMR RF pulses.

23. Apparatus for generating MRI signals from NMR nuclei within an image volume, said apparatus comprising:
   means for nutating nuclei a slice-volume to initiate a TR interval;
   means for repetitively applying 180° NMR RF pulses to further nutate nuclei within the same said slice-volume by substantially 180° at subsequent intervals within the same TR interval and thus to generate a train of NMR spin echoes;
   means for applying a plurality of alternate polarity read-out magnetic gradient pulses between pairs of said 180° NMR RF pulses to produce sub-sequences of plural gradient echoes; and
   means for phase-encoding each said gradient echo within each sub-sequence to traverse a discontinuous trajectory in k-space which is interleaved with the trajectories of other sub-sequences so as to more evenly distribute field inhomogeneity and/or chemical phase shift effects over the phase-encoded dimension of k-space.

24. Apparatus as in claim 23 including means for shifting the time occurrences of gradient echoes within different said sub-sequences so as to more evenly distribute field inhomogeneity and/or chemical phase shift effects over the phase-encoded dimension of k-space.

25. Apparatus as in claim 23 further comprising means for applying a phase-decoding magnetic gradient pulse at the conclusion of each said subsequence to return nuclei phase encoding to the origin of k-space prior to application of the next 180° NMR RF nutation pulse.

26. Apparatus for generating MRI signals from NMR nuclei within an image volume, said apparatus comprising:
   means for generating a train of NMR spin echoes using a sequence of plural 180° NMR RF nutation pulses;
   means for generating a sub-sequence of NMR gradient echoes for each such RF refocused spin echo by using a sequence of alternating polarity read-out magnetic gradient pulses;
   means for phase-encoding each such gradient echo to trace different trajectories in k-space, the phase-encoding being modulated to cause gradient echoes of each said sub-sequence to have k-space trajectories which are interleaved with those of other such sub-sequences so as to more evenly distribute field inhomogeneity and/or chemical phase shift effects over the phase-encoded dimension of k-space; and
   means for applying a phase-decoding magnetic gradient pulse after each said sub-sequence of gradient echoes to return nuclei phase encoding to the origin of k-space prior to generation of the next NMR spin echo.

27. Apparatus as in claim 26 wherein said means for generating a train of NMR spin echoes generates during each of plural TR intervals, by an initial 90° NMR RF nutation pulse followed by a sequence of plural 180° NMR RF nutation pulses, each said RF nutation pulse occurring during a slice-select magnetic gradient pulse $G_z$.

28. Apparatus as in claim 27 wherein said means for generating a sub-sequence of NMR gradient echoes generates a sequence of alternating polarity $G_x$ read-out magnetic gradient pulses occurring after each 180° NMR RF nutation pulse.

29. Apparatus as in claim 28 also including means for generating a dephasing $G_x$ read-out magnetic gradient pulse occurring between said initial 90° NMR RF nutation pulse and the first of said 180° NMR RF nutation pulses.

30. Apparatus as in claim 28 wherein said means for generating a sub-sequence includes means for generating an initial $G_y$ magnetic gradient pulse of a first polarity and subsequent $G_y$ magnetic gradient pulses of a second polarity and a further $G_y$ magnetic gradient pulse of said first polarity to achieve said phase-decoding.

31. Apparatus for generating MRI signals, said apparatus comprising:
 (a) means for subjecting NMR nuclei within an image volume to a perturbing NMR RF nutation pulse;
 (b) means for thereafter subjecting said NMR nuclei to
  (i) a 180° NMR RF nutation pulse followed by
  (ii) a plurality of alternating polarity magnetic gradient read-out pulses to generate a sequence of gradient echoes, and
  (iii) repeating steps (i) and (ii) to generate a further sequence of plural gradient echoes occurring after said 180° NMR RF nutation pulse and before application of another 180° NMR RF nutation pulse.

32. Apparatus as in claim 31 including means for repetitively operating means (a) and (b) in each of plural TR intervals to generate additional sequences of gradient echoes.

33. Apparatus as in claim 31 wherein said means (a) and means (b) include means for generating said NMR RF nutation pulses during a slice volume selecting magnetic gradient pulse in a multi-slice sequence.

34. Apparatus as in claim 33 wherein said means (b) includes means for generating a phase-encoding magnetic gradient pulse of predetermined magnitude, different from the magnitude of other such phase-encoding pulses prior to each magnetic gradient read-out pulse.

35. Apparatus for generating MRI signals, said apparatus comprising:
 (a) means for subjecting NMR nuclei within an image volume to a perturbing NMR RF nutation pulse;
 (b) means for thereafter subjecting said NMR nuclei to
  (i) a 180°60 NMR RF nutation pulse followed by
  (ii) a plurality of alternating polarity magnetic gradient read-out pulses to generate a sequence of gradient echoes, and
  (iii) repeating steps (i) and (ii) to generate a further sequence of gradient echoes,
 said means (a) and means (b) including means for generating said NMR RF nutation pulses during a slice volume selecting magnetic gradient pulse in a multi-slice sequence;
 said means (b) includes means for generating a phase-encoding magnetic gradient pulse of predetermined magnitude, different from the magnitude of other such phase-encoding pulses prior to each magnetic gradient read-out pulse; and
 wherein means (b) includes means for causing the magnitude of phase-encoding magnetic gradient pulses within each repetition to generate MRI gradient echoes respectively corresponding to non-contiguous trajectories in k-space, the MRI gradient echoes generated from other repetitions of respectively filling in the remaining contiguous trajectories in k-space in an interleaved fashion.

36. Apparatus as in claim 35 wherein means (b) includes means for causing the phase-encoding magnetic gradient pulses to have magnitudes which generate a sequence of MRI gradient echoes in k-space having substantially reduced phase shifts between next-adjacent k-space echoes caused by field inhomogeneity and/or chemical shift effects occurring during each repetition.

37. Apparatus as in claim 36 wherein the means (b) includes means for causing the phase shifts of said field inhomogeneity and/or chemical shift effects to increase monotonically in approximately equal amount from one gradient echo to the next throughout the phase-encoded dimension of k-space.

38. A method as in claim 37 including means for generating a phase-return magnetic gradient pulse applied to said NMR nuclei having polarity and magnitude for substantially cancelling all prior phase-encoding magnetic gradient pulses and thus momentarily returning the NMR nuclei to the same point in k-space prior to each repetition of a 180° RF pulse.

39. Apparatus for generating MRI signals, said apparatus comprising:
 (a) means for subjecting NMR nuclei within an image volume to a perturbing NMR RF nutation pulse;
 (b) means for thereafter subjecting said NMR nuclei to
  (i) a 180°60 NMR RF nutation pulse followed by
  (ii) a plurality of alternating polarity magnetic gradient read-out pulses to generate a sequence of gradient echoes, and
  (iii) repeating steps (i) and (ii) to generate a further sequence of gradient echoes,
 said means (a) and means (b) including means for generating said NMR RF nutation pulses during a slice volume selecting magnetic gradient pulse in a multi-slice sequence;
 said means (b) includes means for generating a phase-encoding magnetic gradient pulse of predetermined magnitude, different from the magnitude of other such phase-encoding pulses prior to each magnetic gradient read-out pulse; and
 means for generating a phase-return magnetic gradient pulse applied to said NMR nuclei having polarity and magnitude for substantially cancelling all prior phase-encoding magnetic gradient pulses and thus momentarily returning the NMR nuclei to the same point in k-space prior to each repetition of a 180° RF pulse.

40. Apparatus as in claim 38 wherein means (a) and (b) are repetitively operated to define plural TR intervals generating additional sequences of gradient echoes.

41. A method for generating MRI signals from NMR nuclei with an image volume, said method comprising:
 nutating nuclei within a slice-volume to initiate a TR interval;
 repetitively applying 180° NMR RF pulses to further nutate nuclei within the same said slice-volume by substantially 180° at subsequent intervals within the same TR interval and thus to generate a train of NMR spin echoes;
 between pairs of said 180° NMR RF pulses, applying a plurality of alternate polarity read-out magnetic gradient pulses to produce sub-sequences of gradient echoes; and wherein the time occurrences of gradient echoes within different said sub-sequences are relatively shifted so as to more evenly distribute field inhomogeneity and/or chemical phase shift effects over the phase-encoded dimension if k-space.

42. A method for generating MRI signals from NMR nuclei within an image volume, said method comprising:
   nutating nuclei within a slice-volume to initiate a TR interval;
   repetitively applying 180° NMR RF pulses to further nutate nuclei within the same said slice-volume by substantially 180° at subsequent intervals within the same TR interval and thus to generate a train of NMR spin echoes;
   between pairs of said 180° NMR RF pulses, applying a plurality of alternate polarity read-out magnetic gradient pulses to produce sub-sequences of gradient echoes; and
   at the conclusion of each said subsequence, applying a phase-decoding magnetic gradient pulse to return nuclei phase encoding to the same point in k-space prior to application of the next 180° NMR RF nutation pulse.

43. Apparatus for generating MRI signals from NMR nuclei within an image volume, said apparatus comprising:
   means for nutating nuclei within a slice-volume to initiate a TR interval;
   means for repetitively applying 180° NMR RF pulses to further nutate nuclei within the same said slice-volume by substantially 180° at subsequent intervals within the same TR interval and thus to generate a train of NMR spin echoes;
   means for applying a plurality of alternate polarity read-out magnetic gradient pulses between pairs of said 180° NMR RF pulses to produce sub-sequences of gradient echoes; and
   means for shifting the time occurrences of gradient echoes within different said sub-sequences so as to more evenly distribute field inhomogeneity and/or chemical phase shift effects over the phase-encoded dimension of k-space.

44. Apparatus for generating MRI signals from NMR nuclei within an image volume, said apparatus comprising:
   means for nutating nuclei within a slice-volume to initiate a TR interval;
   means for repetitively applying 180° NMR RF pulses to further nutate nuclei within the same said slice-volume by substantially 180° at subsequent intervals within the same TR interval and thus to generate a train of NMR spin echoes;
   means for applying a plurality of alternate polarity read-out magnetic gradient pulses between pairs of said 180° NMR RF pulses to produce sub-sequences of gradient echoes; and
   means for applying a phase-decoding magnetic gradient pulse at the conclusion of each said subsequence to return nuclei phase encoding to the origin of k-space prior to application of the next 180° NMR RF nutation pulse.

45. A method for generating MRI signals from NMR nuclei within an image volume, said method comprising:
   (i) nutating nuclei within a selected volume to initiate a TR interval;
   (ii) applying a 180° NMR RF pulse to further nutate nuclei within said volume by substantially 180° at a subsequent interval to generate a NMR spin echo RF response; and
   (iii) applying a plurality of phase-encoding magnetic and gradient pulses and alternate polarity read-out magnetic gradient pulses to produce a sequence of plural gradient echoes wherein the time domain positions of at least some of said gradient echoes is shifted as a result of shifted time domain positions for the phase-encoding magnetic gradient pulses and alternate polarity read-out magnetic gradient pulses from the nominally expected respective Hahn spin echo times to provide controlled increments of undesired phase shifts in contiguous k-space MRI data.

46. A method as in claim 45 wherein steps (ii) and (iii) are repeated at least once after one occurrence of step (i).

47. A method for generating MRI signals from NMR nuclei within an image volume, said method comprising:
   (i) nutating nuclei within a selected volume to initiate a TR interval;
   (ii) applying a 180° NMR RF pulse to further nutate nuclei within said volume by substantially 180° at a subsequent interval to generate a NMR spin echo RF response; and
   (iii) means for applying a plurality of phase-encoding magnetic and gradient pulses and alternate polarity read-out magnetic gradient pulses to produce a sequence of plural gradient echoes wherein the time domain positions of at least some of said gradient echoes is shifted as a result of shifted time domain positions for the phase-encoding magnetic gradient pulses and alternate polarity read-out magnetic gradient pulses from the nominally expected respective Hahn spin echo times to provide controlled increments of undesired phase shifts in contiguous k-space MRI data.

48. A method as in claim 47 wherein steps (ii) and (iii) are operated at least twice after one operating of means (i).

* * * * *

UNITED STATES PATENT AND TRADEMARK OFFICE
CERTIFICATE OF CORRECTION

PATENT NO. : 5,270,654
DATED : December 14, 1993
INVENTOR(S) : David A. Feinberg et al It is certified that error appears in the above-indentified patent and that said Letters Patent is hereby corrected as shown below:

```
Column 23, line 36, claim 3, chang "if" to —of—.
Column 25, line 53, change "19" to —20—.
Column 28, line 17, delete "A method" and insert —Apparatus—.
Column 30, lines 32,35 & 37, delete "A method" and insert —Apparatus—.
                              before "nutating" insert —means for—;and
                              before "applying' insert —means for—.
Column 30, line 53, delete "A method" and insert —Apparatus—.
```

Signed and Sealed this

Twenty-eighth Day of November 1995

Attest:

BRUCE LEHMAN

Attesting Officer          Commissioner of Patents and Trademarks